US009536946B2

(12) United States Patent  
Park et al.

(10) Patent No.: US 9,536,946 B2  
(45) Date of Patent: Jan. 3, 2017

(54) SEMICONDUCTOR DEVICE AND METHOD FOR MANUFACTURING THE SAME

(71) Applicant: SAMSUNG ELECTRONICS CO., LTD., Suwon-Si, Gyeonggi-Do (KR)

(72) Inventors: Jae-Ho Park, Suwon-Si (KR); Taejoong Song, Seongnam-Si (KR); Sanghoon Baek, Seoul (KR); Jintae Kim, Suwon-Si (KR); Giyoung Yang, Seoul (KR); Hyosig Won, Suwon-Si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/833,983

(22) Filed: Aug. 24, 2015

(65) Prior Publication Data

US 2016/0056155 A1 Feb. 25, 2016

Related U.S. Application Data

(60) Provisional application No. 62/041,467, filed on Aug. 25, 2014.

(30) Foreign Application Priority Data

Jan. 28, 2015 (KR) ........................ 10-2015-0013578

(51) Int. Cl.
*H01L 27/088* (2006.01)
*H01L 29/06* (2006.01)
*H01L 29/08* (2006.01)
*H01L 29/417* (2006.01)
*H01L 27/02* (2006.01)
(Continued)

(52) U.S. Cl.
CPC ....... *H01L 29/0642* (2013.01); *H01L 27/0207* (2013.01); *H01L 27/092* (2013.01); *H01L 27/0924* (2013.01); *H01L 29/0847* (2013.01); *H01L 29/41758* (2013.01); *H01L 29/41791* (2013.01); *H01L 21/823871* (2013.01)

(58) Field of Classification Search
CPC ....................... H01L 29/7827; H01L 29/66666
USPC .................................. 257/368–369, 382–393
See application file for complete search history.

(56) References Cited

U.S. PATENT DOCUMENTS 8,481,404 B2 * 7/2013 Kammler .......... H01L 21/76229
257/E21.551
2005/0001271 A1 1/2005 Kobayashi
(Continued)

FOREIGN PATENT DOCUMENTS

| JP | 2004-342757 | 12/2004 |
|----|-------------|---------|
| JP | 2011-187530 | 9/2011 |
| KR | 1020140062404 | 5/2014 |

*Primary Examiner* — Cuong Q Nguyen
(74) *Attorney, Agent, or Firm* — Volentine & Whitt, PLLC

(57) ABSTRACT

A semiconductor device includes a substrate having an active region, a gate structure intersecting the active region and extending in a first direction parallel to a top surface of the substrate, a first source/drain region and a second source/drain region disposed in the active region at both sides of the gate structure, respectively, and a first modified contact and a second modified contact in contact with the first source/drain region and the second source/drain region, respectively. The distance between the gate structure and the first modified contact is smaller than the distance between the gate structure and the second modified contact.

17 Claims, 27 Drawing Sheets

(51) Int. Cl.
*H01L 27/092* (2006.01)
*H01L 21/8238* (2006.01)

(56) References Cited

U.S. PATENT DOCUMENTS

| | | | |
|---|---|---|---|
| 2007/0102726 A1* | 5/2007 | Watanabe | H01L 27/11 |
| | | | 257/194 |
| 2011/0215423 A1 | 9/2011 | Iwamatsu et al. | |
| 2014/0092506 A1* | 4/2014 | Ahsan | H01L 27/027 |
| | | | 257/328 |
| 2015/0206890 A1 | 7/2015 | Liaw | |

* cited by examiner

SEMICONDUCTOR DEVICE AND METHOD FOR MANUFACTURING THE SAME

PRIORITY STATEMENT

This U.S. non-provisional patent application claims priority under 35 U.S.C. §119 from U.S. Provisional Patent application Ser. No. 62/041,467, filed on Aug. 25, 2014 in the United States Patent and Trademark Office, and Korean Patent Application No. 10-2015-0013578, filed on Jan. 28, 2015 in the Korean Intellectual Property Office, the disclosures of which are hereby incorporated by reference in their entirety.

BACKGROUND

The inventive concepts relate to a semiconductor device and to a method of manufacturing the same. More particularly, the inventive concepts relate to a semiconductor device including a field effect transistor and to a method of manufacturing the same.

Semiconductor devices are widely used in the electronics industry because of their small sizes, multi-functional characteristics, and/or low manufacturing costs. Semiconductor devices may be categorized as any one of semiconductor memory devices storing logical data, semiconductor logic devices processing logical data, and hybrid semiconductor devices having both the function of semiconductor memory devices and the function of semiconductor logic devices. As the electronics industry has developed the demand for semiconductor devices with improved characteristics have increased. For example, semiconductor devices which are more reliable, operate at higher speeds, and/or provide greater numbers of functions are ever in demand. As a result of satisfying these demands, the architecture and structure of elements of semiconductor devices have become more and more complicated and semiconductor devices have become more highly integrated.

SUMMARY

According to one aspect of the inventive concepts, there is provided a semiconductor device including a substrate having an active region, a gate structure intersecting the active region and extending longitudinally in a first direction parallel to a top surface of the substrate, a first source/drain region and a second source/drain region adjacent opposite sides of the gate structure, respectively, and a first modified contact and a second modified contact in contact with the first source/drain region and the second source/drain region, respectively, and in which the distance between the gate structure and the first modified contact is smaller than the distance between the gate structure and the second modified contact.

According to another aspect of the inventive concepts, there is provided a semiconductor device including a first power node and an output node, an input node, a first transistor whose gate is constituted by the input node, a second transistor whose gate is constituted by the input node, a first modified contact electrically connecting the first power node to the first transistor, a third modified contact electrically connecting the second power node to the second transistor, and a fourth modified contact electrically connecting the second transistor to the output node, and in which a connection area between the first modified contact and the first transistor is greater than a connection area between the second modified contact and the first transistor, and a connection area between the third modified contact and the second transistor is greater than a connection area between the fourth modified contact and the second transistor.

According to still another aspect of the inventive concepts, there is provided a semiconductor device including a plurality of transistors constituted by a common gate extending longitudinally across active regions of a substrate in a first direction, first source/drain regions adjacent one side of the common gate, and second source/drain regions adjacent the other side of the gate, an insulating layer disposed on the substrate, a first standard contact extending vertically in the insulating layer and electrically connected to one of the first source drain regions constituting a first one of the transistors, a second standard contact extending vertically in the insulating layer and electrically connected to one of the second source drain regions constituting the first one of the transistors, a first modified contact extending vertically in the insulating layer and electrically connected to one of the first source drain regions constituting a second one of the transistors, and a second modified contact extending vertically in the insulating layer and connected to one of the second source drain regions constituting the second one of the transistors. In a plan view of the device, the distance between the first standard contact and the gate in a second direction perpendicular to the first direction is the same as the distance between the second standard contact and the gate in the second direction, the distance between the first modified contact and the gate in a second direction perpendicular to the first direction is less than the distance between the second modified contact and the gate in the second direction, and the first standard contact has the same shape as the second standard contact. Furthermore, in the plan view, the distance between the first modified contact and the gate in the second direction is different from that between each of the standard contacts and the gate, or the shape of the first modified contact is different from each of those of the standard contacts. And, the distance between the second modified contact and the gate in the second direction is different from that between each of the standard contacts and the gate, or the shape of the first modified contact is different from each of those of the standard contacts.

BRIEF DESCRIPTION OF THE DRAWINGS

The inventive concepts will become more apparent in view of the attached drawings and accompanying detailed description.

DETAILED DESCRIPTION OF THE PREFERRED EMBODIMENTS

Figure 1A:
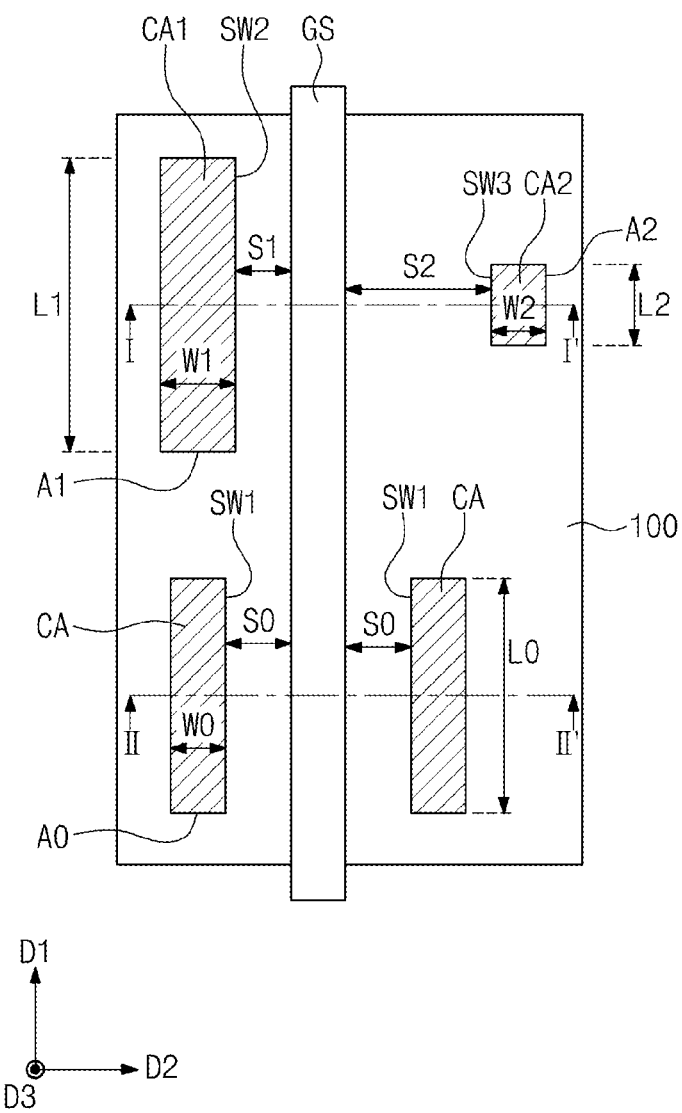
FIG. 1A is a plan view of a semiconductor device according to an embodiment of the inventive concepts.

The inventive concepts will now be described more fully hereinafter with reference to the accompanying drawings, in which exemplary embodiments of the inventive concepts are shown. The advantages and features of the inventive concepts and methods of achieving them will be apparent from the following exemplary embodiments that will be described in more detail with reference to the accompanying drawings. It should be noted, however, that the inventive concepts are not limited to the following exemplary embodiments, and may be implemented in various forms. Accordingly, the exemplary embodiments are provided only to disclose the inventive concepts and let those skilled in the art know the category of the inventive concepts. In the drawings, embodiments of the inventive concepts are not limited to the specific examples provided herein and are exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof. The direction of an element or feature referred to in connection with the term "extends" will generally correspond to the longitudinal direction or direction of the longest dimension of the particular element or feature. The term "layout" may refer to an arrangement and/or shapes of particular features or elements or may refer to the relative location and shape of an individual element or feature as the context will make clear. The term "oblong" encompasses various forms from rectangular to oval (island-shaped).

Additionally, the embodiment in the detailed description will be described with sectional views as ideal exemplary views of the inventive concepts. Accordingly, shapes of the exemplary views may be modified according to manufacturing techniques and/or allowable errors. Therefore, the embodiments of the inventive concepts are not limited to the specific shape illustrated in the exemplary views, but may include other shapes that may be created according to manufacturing processes. Areas exemplified in the drawings have general properties, and are used to illustrate specific shapes of elements. Thus, this should not be construed as limited to the scope of the inventive concepts.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present inventive concepts explained and illustrated herein include their complementary counterparts. The same reference numerals or the same reference designators denote the same elements throughout the specification.

Moreover, exemplary embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

First Embodiment

Figure 1B:
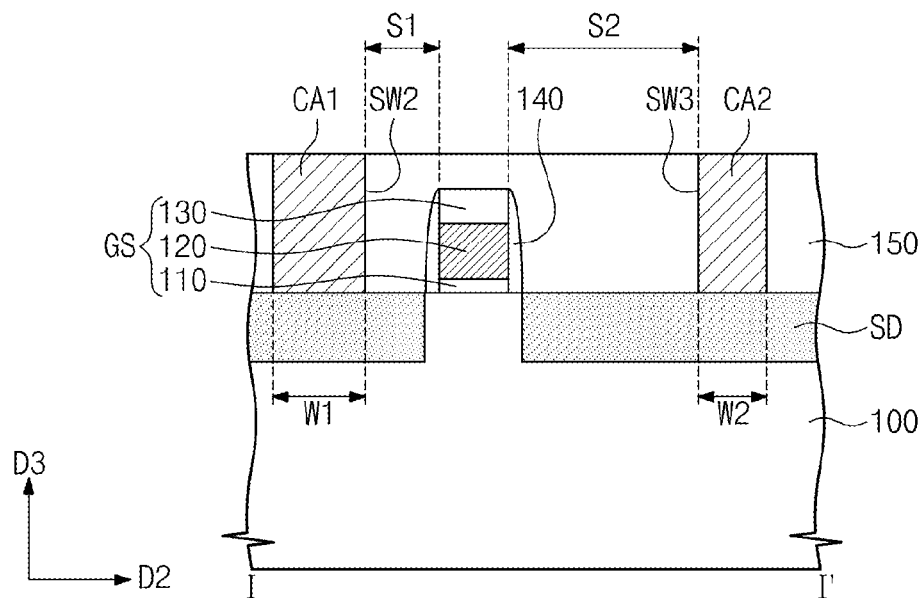
FIG. 1B is a cross-sectional view taken along line I-I' of FIG. 1A.
Figure 1C:
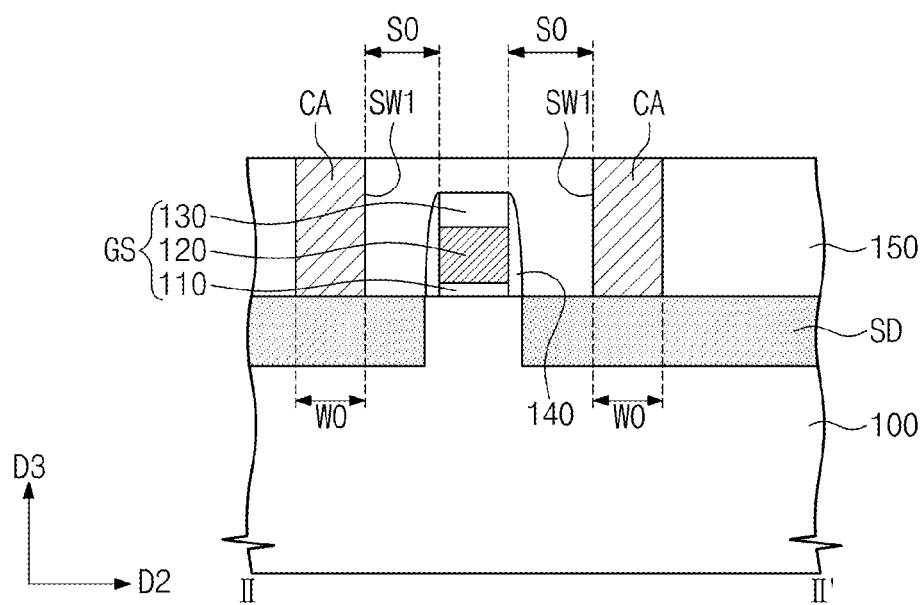
FIG. 1C is a cross-sectional view taken along line II-II' of FIG. 1A.

Referring to FIGS. 1A, 1B, and 1C, an embodiment of a semiconductor device according to the inventive concepts has a substrate 100. The substrate 100 may be a semiconductor substrate including silicon, germanium or silicon-germanium or may be a compound semiconductor substrate. Even though not shown in these figures, a device isolation structure or simply "device isolation" may be disposed in the substrate 100 to define an active region of the substrate 100. That is, the active region may correspond to a portion of the substrate 100 that is surrounded by at least a portion of the device isolation structure. The active region may be doped with impurities of a first conductivity type. In practice, several active regions may be defined by the device isolation structure. The active regions and the device isolation will be described later in more detail in connection with another embodiment of the inventive concepts.

A gate structure GS may be disposed on the substrate 100. The gate structure GS may have a linear shape that extends in a first direction D1 parallel to a top surface of the substrate 100. The gate structure GS may include a gate insulating pattern 110, a gate electrode 120, and a capping pattern 130 which are sequentially stacked. The gate insulating pattern 110 may include at least one of a silicon oxide layer, a silicon oxynitride layer, or a high-k dielectric layer. The high-k dielectric layer may have a dielectric constant higher than that of a silicon oxide layer. The gate electrode 120 may include at least one of a doped semiconductor, a metal, and a conductive metal nitride. The capping pattern 130 may include at least one of a silicon oxide layer, a silicon nitride layer, and a silicon oxynitride layer.

Gate spacers 140 may be disposed on both sidewall surfaces of the gate structure GS. The gate spacers 140 may include at least one of silicon oxide, silicon nitride, and silicon oxynitride.

Source/drain regions SD may be disposed in the active region at both sides of the gate structure GS. The source/drain regions SD may be regions doped with impurities of a second conductivity type which is different from the first conductivity type of the active region. Even though not shown in the drawings, a metal silicide may be disposed on each of the source/drain regions SD. The metal silicide may be formed by a reaction of a semiconductor element of the source/drain region SD and a metal.

A first interlayer insulating layer 150 may be disposed on the substrate 100 to cover the gate structure GS. The first interlayer insulating layer 150 may include at least one of a silicon oxide layer and a silicon oxynitride layer.

Contacts CA, CA1, and CA2 may extend through the first interlayer insulating layer 150 so as to be connected to the source/drain regions SD. The contacts CA, CA1, and CA2 may be disposed at both sides of the gate structure GS. In the illustrated example of this embodiment, contacts CA and CA1 (or CA and CA2) are disposed at a respective side of the gate structure GS as arranged in (spaced along) the first direction D1. The contacts CA, CA1, and CA2 may have bar shapes, i.e., may be oblong as viewed in plan, with the long axes of the contacts extending in the first direction D1. In addition, top surfaces of the contacts CA, CA1, and CA2 may be disposed at substantially the same level. The contacts CA, CA1, and CA2 may include standard contacts CA, a first modified contact CA1, and a second modified contact CA2.

The standard contacts CA may be spaced apart from each other with the gate structure GS interposed therebetween. Any one of the standard contacts CA may be spaced apart from the gate structure GS by a standard distance S0 in a second direction D2. Each of the standard contacts CA may have a standard area A0 when viewed from above, i.e., in plan. The standard area A0 may correspond to a contact area between the standard contact CA and the source/drain region SD. In addition, each of the standard contacts CA may have a standard width W0 in the second direction D2 and a standard length L0 in the first direction D1. The standard contacts CA may have first sidewall surface surfaces SW1 facing the gate structure GS.

The first modified contact CA1 may be disposed at one side of the gate structure GS. The first modified contact CA1 may be spaced apart from the gate structure GS by a first distance S1 in the second direction D2. The first distance S1 may be equal to or smaller than the standard distance S0. The first modified contact CA1 may have a first area A1 when viewed from above, i.e., in plan. The first area A1 may correspond to a contact area between the first modified contact CA1 and the source/drain region SD. The first area A1 may be greater than the standard area A0. In addition, the first modified contact CA1 may have a first width W1 in the second direction D2 and a first length L1 in the first direction D1. The first width W1 may be greater than or equal to the standard width W0, and the first length L1 may be greater than or equal to the standard length L0. The first modified contact CA1 may include a second sidewall surface SW2 facing the gate structure GS. An area of the second sidewall surface SW2 may be greater than or equal to an area of the first sidewall surface SW1.

The second modified contact CA2 may be disposed at another side of the gate structure GS. The second modified contact CA2 may be spaced apart from the gate structure GS by a second distance S2 in the second direction D2. The second distance S2 may be equal to or greater than the standard distance S0. The second modified contact CA2 may have a second area A2 when viewed from above, i.e., in plan. The second area A2 may correspond to a contact area between the second modified contact CA2 and the source/drain region SD. The second area A2 may be smaller than the standard area A0. In addition, the second modified contact CA2 may have a second width W2 in the second direction D2 and a second length L2 in the first direction D1. The second width W2 may be smaller than or equal to the standard width W0, and the second length L2 may be smaller than or equal to the standard length L0. The second modified contact CA2 may include a third sidewall surface SW3 facing the gate structure GS. An area of the third sidewall surface SW3 may be smaller than or equal to the area of the first sidewall surface SW1.

In the first and second modified contacts CA1 and CA2, the first area A1 may be greater than the second area A2. The first distance S1 may be smaller than the second distance S2. The first length L1 may be greater than the second length L2.

In an embodiment of the inventive concepts, the first modified contact CA1 may be connected to a power node to which a power voltage is applied, and the second modified contact CA2 may be connected to an output node outputting a signal processed by a circuit. The power voltage may be a driving voltage or a ground voltage. In other words, a field effect transistor, which includes the source/drain regions SD and the gate structure GS, may be connected to the power node through the first modified contact CA1. Here, since the first modified contact CA1 has the first area A1 which is relatively wide, a resistance between the power node and the field effect transistor may be reduced. In other words, a voltage drop (e.g., IR-DROP) may be reduced to improve electrical characteristics of the semiconductor device.

In addition, the field effect transistor may be connected to the output node through the second modified contact CA2. Here, a parasitic capacitance may occur between the second modified contact CA2 and the gate structure GS. As the parasitic capacitance increases, an operating speed of the device may be reduced. However, according to embodiments of the inventive concepts, the second modified contact CA2 may be spaced apart from the gate structure GS by a relatively great distance (i.e., the second distance S2), so the parasitic capacitance may be reduced. In addition, since the third sidewall surface SW3 of the second modified contact CA2 has the relatively small area, the parasitic capacitance may be further reduced. As a result, the operating speed of the device may be improved.

Figure 2:
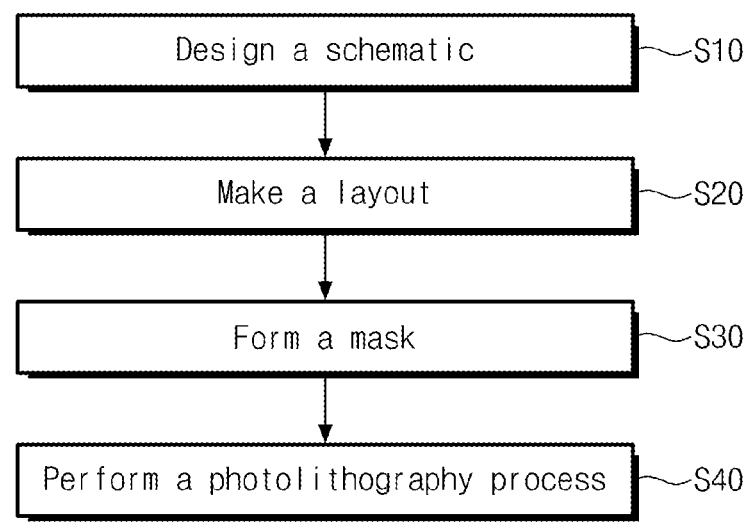
FIG. 2 is a flow chart illustrating a method of manufacturing a semiconductor device according to an embodiment of the inventive concepts.

FIG. 2 is a flow chart illustrating a method of manufacturing a semiconductor device according to an embodiment of the inventive concepts.

Referring to FIG. 2, a method of manufacturing the semiconductor device of FIGS. 1A to 1C may include designing a schematic (S10), making a layout (S20), forming a mask (S30), and performing a photolithography process (S40). Moreover, to form the first and second modified contacts CA1 and CA2 of FIGS. 1A to 1C, the method may comprise an annotating process using a parameter in the step S10 of designing the schematic (described later with reference to FIG. 7 as an example) or an annotating process using a marker in the step S20 of making the layout (described later with reference to FIG. 6 as an example). In either case of using the parameter or the marker, the first and second modified contacts CA1 and CA2 having different shapes from the standard contacts CA may be realized in the physical semiconductor device fabricating processes (e.g., the step S30 of forming the mask and the step S40 of performing the photolithography process).

A method of manufacturing a semiconductor device according to an embodiment of the inventive concepts will now be described with reference to FIGS. 3a to 5B. Mainly only the process of fabricating the first and second modified contacts CA1 and CA2, using step S20 of FIG. 2 (i.e., by means of the marker), will be described in detail.

Figure 3A:
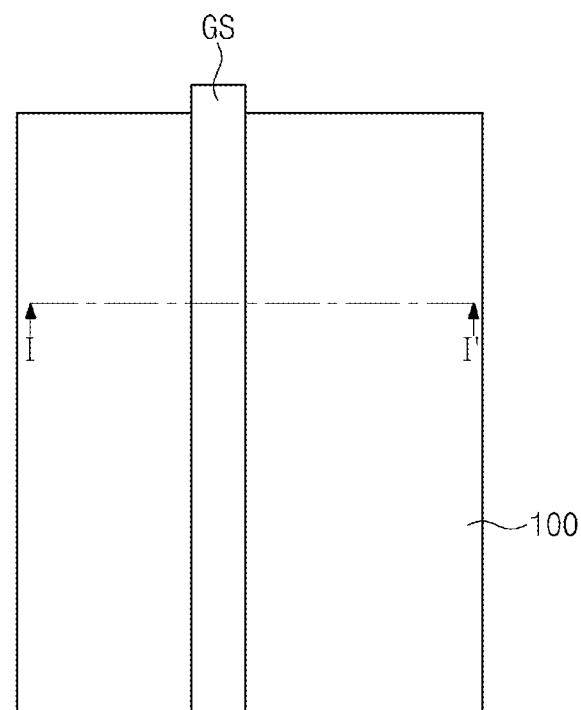
FIGS. 3A, 4A and 5A are plan views illustrating a method of manufacturing a semiconductor device according to an embodiment of the inventive concepts.
Figure 3A:
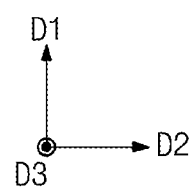
Figure 3B:
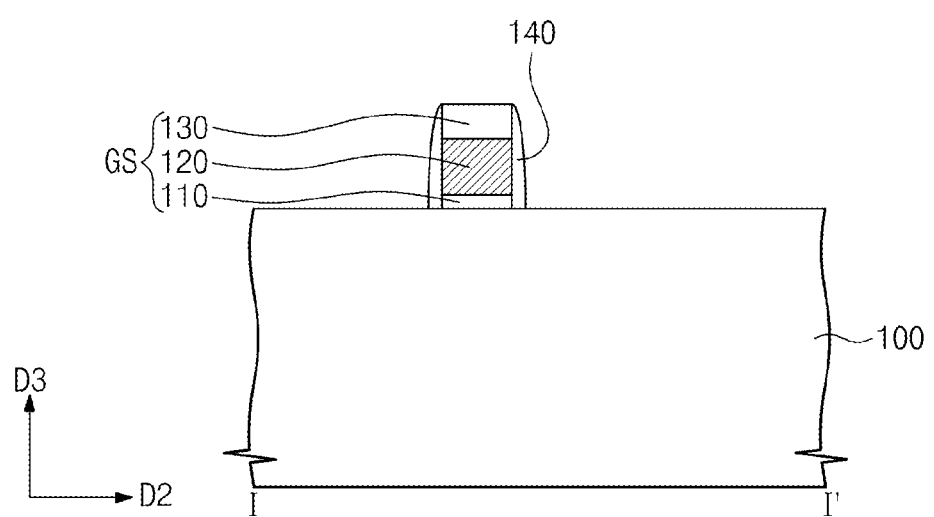
FIGS. 3B, 4B and 5B are cross-sectional views taken along lines I-I' of FIGS. 3A, 4A and 5A, respectively.

Referring to FIGS. 3A and 3B, a substrate 100 may be provided. The substrate 100 may be a semiconductor substrate including silicon, germanium or silicon-germanium or may be a compound semiconductor substrate. Even though not shown in these figures, device isolation may be formed in the substrate 100 to define an active region(s). The device isolation may be formed by a shallow-trench isolation (STI) method.

The active region may correspond to a portion of the substrate 100 which is surrounded by the device isolation pattern. The active region may be doped with impurities of a first conductivity type.

A gate structure GS may be formed on the substrate 100 to cross the active region. The gate structure GS may extend in a first direction D1 parallel to a top surface of the substrate 100. The gate structure GS may have a linear shape. The gate structure GS may include a gate insulating pattern 110, a gate electrode 120, and a capping pattern 130 which are sequentially stacked. The gate insulating pattern 110 may include at least one of a silicon oxide layer, a silicon oxynitride layer, and a high-k dielectric layer having a dielectric constant higher than that of a silicon oxide layer. The gate electrode 120 may include at least one of a doped semiconductor, a metal, and a conductive metal nitride. The capping pattern 130 may include at least one of a silicon oxide layer, a silicon nitride layer, and a silicon oxynitride layer.

In an embodiment, a gate insulating layer, a gate layer, and a capping layer may be sequentially formed on the substrate 100, and a patterning process may be performed on the capping layer, the gate layer, and the gate insulating layer to form the gate insulating pattern 110, the gate electrode 120, and the capping pattern 130. Each of the gate insulating layer, the gate layer, and the capping layer may be formed by a chemical vapor deposition (CVD) process and/or a sputtering process.

Gate spacers 140 may be formed on both sidewall surfaces of the gate structure GS. In an embodiment, a spacer layer may be conformally formed on the substrate 100 and the gate structure GS, and then the spacer layer may be anisotropically etched to form the gate spacers 140. The spacer layer may include at least one of a silicon oxide layer, a silicon nitride layer, and a silicon oxynitride layer.

Figure 4A:
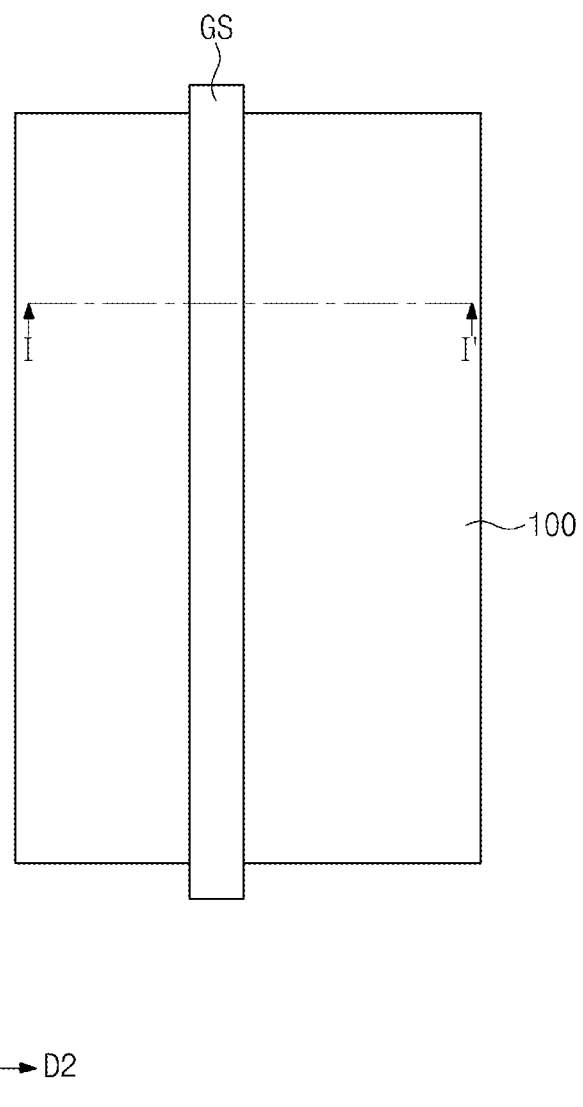
Figure 4B:
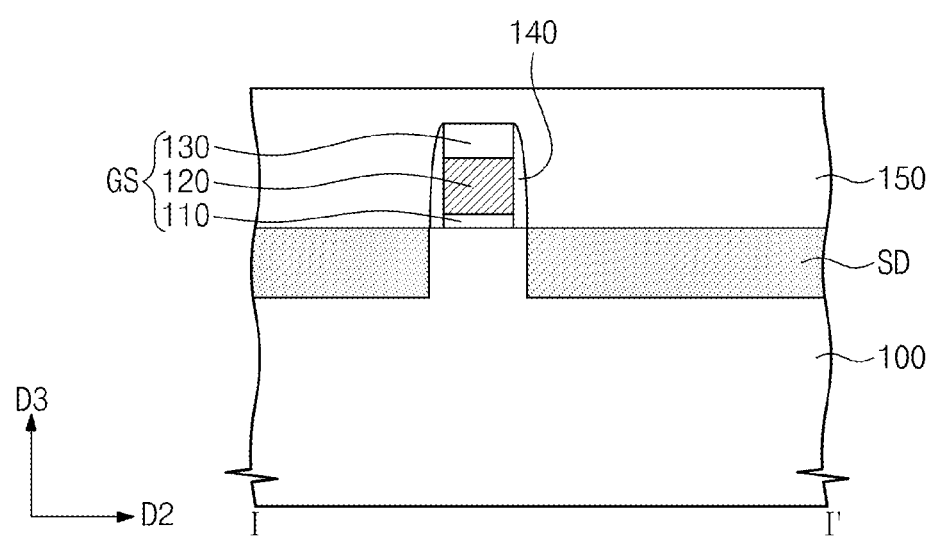

Referring to FIGS. 4A and 4B, an ion implantation process may be performed on the resultant structure having the gate structure GS to form source/drain regions SD. The source/drain regions SD may be formed in the active region at both sides of the gate structure GS. The ion implantation process may be performed using the gate structure GS as an ion implantation mask such that source/drain region SD is not be formed in a portion of the active region that is disposed under the gate structure GS, i.e. in a region vertically aligned with the gate structure GS. The source/drain regions SD may be doped with impurities of a second conductivity type different from the first conductivity type.

A first interlayer insulating layer 150 covering the gate structure GS may be formed on the substrate 100. The first interlayer insulating layer 150 may include at least one of a silicon oxide layer and a silicon oxynitride layer.

Figure 6:
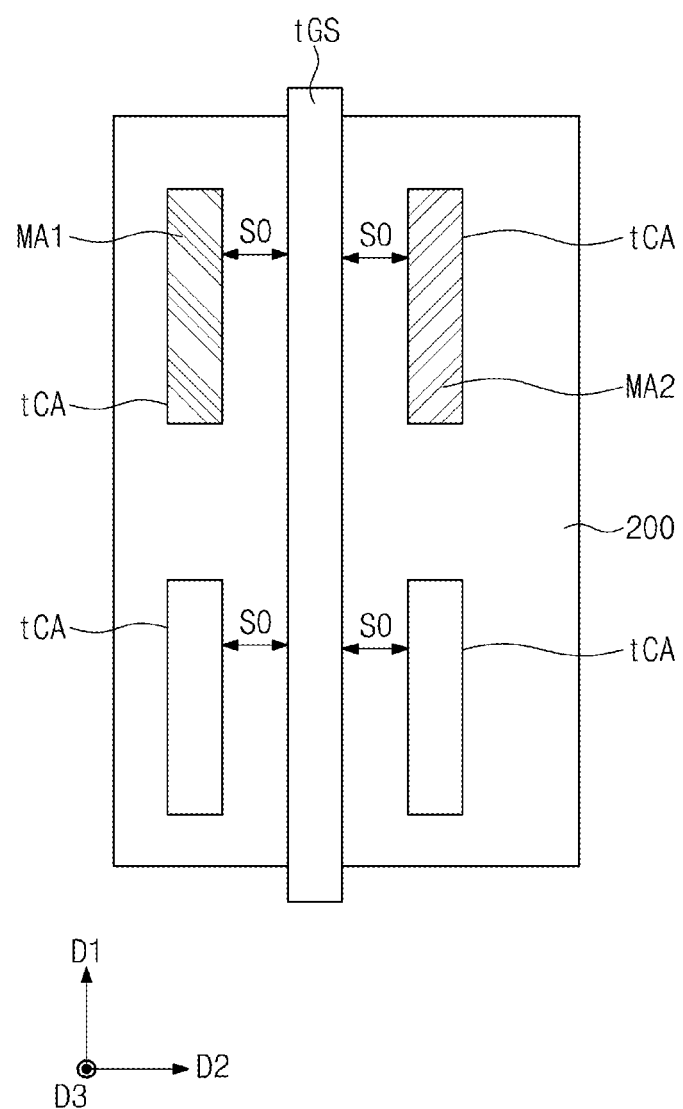
FIG. 6 is a diagram of a layout used in a method of manufacturing a semiconductor device according to an embodiment of the inventive concepts.

FIG. 6 illustrates a process of making a layout of a semiconductor device, and of annotating the layout with a marker, in a method of manufacturing the device according to the inventive concepts.

Referring to FIG. 6, a gate layout tGS defining a gate of a transistor may be disposed on a layout plate 200. Contact-hole layouts tCA defining contact holes (described in more detail later) may be disposed at both sides of the gate layout tGS. The contact-hole layouts tCA may be arranged along the first direction D1 and a second direction D2. The contact-hole layouts tCA arranged in the second direction D2 may be spaced part from each other with the gate layout tGS interposed therebetween. The second direction D2 may intersect the first direction D1.

The gate layout tGS and the contact-hole layouts tCA may be provided by a standard cell library. In other words, contact-hole layouts tCA of the same size may be specified in a standard cell library. In addition, each of the contact-hole layouts tCA may be spaced apart from the gate layout tGS by the same standard distance S0.

In embodiments of the inventive concepts, at least one of the contact-hole layouts tCA may be annotated by a first marker MA1. At least another of the contact-hole layouts tCA may be annotated by a second marker MA2. The first marker MA1 may define (specify the layout of) a first modified contact hole H2 (described in detail later), and the second marker MA2 may define a second modified contact hole H3 (also described in detail later).

Referring to FIG. 6, the first marker MA1 may be representative of a variation between a first area A1 of the first modified contact hole H2 and a standard area (e.g., an exposure area) A0 of a standard contact hole H1 (described in detail later). Here, the variation may be a positive value. In other words, the first marker MA1 is an indicator that the first modified contact hole H2 has a greater exposure area than the standard contact hole H1. In addition, the first marker MA1 may show a variation between a first distance S1 and the standard distance S0. The first distance S1 may correspond to a horizontal distance between the first modified contact hole H2 and the gate structure GS, and the standard distance S0 may correspond to a horizontal distance between the standard contact hole H1 and the gate structure GS. The variation between the first distance S1 and the standard distance S0 may be a negative value. In other words, the first marker MA1 is an indicator that the first modified contact hole H2 is closer to the gate structure GS than the standard contact hole H1.

The second marker MA2 may be representative of a variation between a second area A2 of the second modified contact hole H3 and the standard area A0 of the standard contact hole H1. Here, the variation may be a negative value. In other words, the second marker MA2 may be an indicator that the second modified contact hole H3 has a smaller exposure area than the standard contact hole H1. In addition, the second marker MA2 may be representative of a variation between a second distance S2 and the standard distance S0. The second distance S2 may correspond to a horizontal distance between the second modified contact hole H3 and the gate structure GS. Here, the variation between the second distance S2 and the standard distance S0 may be a positive value. In other words, the second marker MA2 may be an indicator that the second modified contact hole H3 is further from the gate structure GS than the standard contact hole H1.

According to embodiments of the inventive concepts, the modified contacts of at least one modified transistor of standard transistors formed using one standard cell library may be formed differently from the standard contacts CA by means of the markers MA1 and MA2. Thus, the layout of the semiconductor device according to the inventive concepts may be made using a standard cell library, i.e., without the need for a plurality of cell libraries. The contact-hole layouts tCA annotated by the markers MA1 and MA2 in the layout may define the modified contact holes H2 and H3 which have different sizes from the standard contact hole H1 and are spaced apart from the gate structure GS by different distances from the standard distance S0.

A mask for the forming of the contact holes H1, H2, and H3 may be fabricated based on the layout described with reference to FIG. 6. The mask may be a reticle used in a photolithography process. The shape of the horizontal cross section of the mask may correspond to the plan view of the semiconductor device illustrated in FIG. 5A.

Figure 5A:
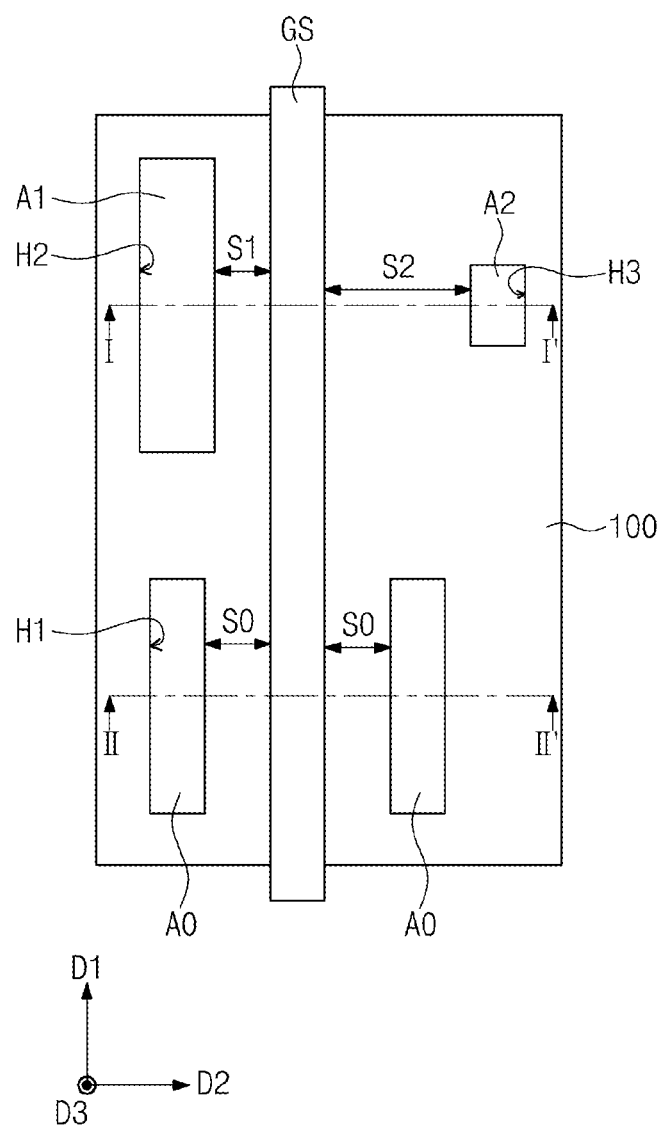
Figure 5B:
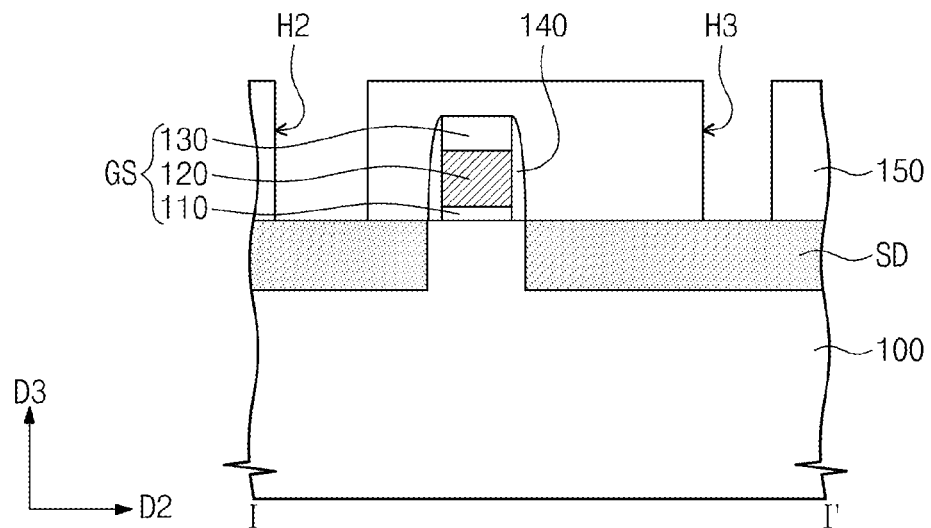
Figure 5C:
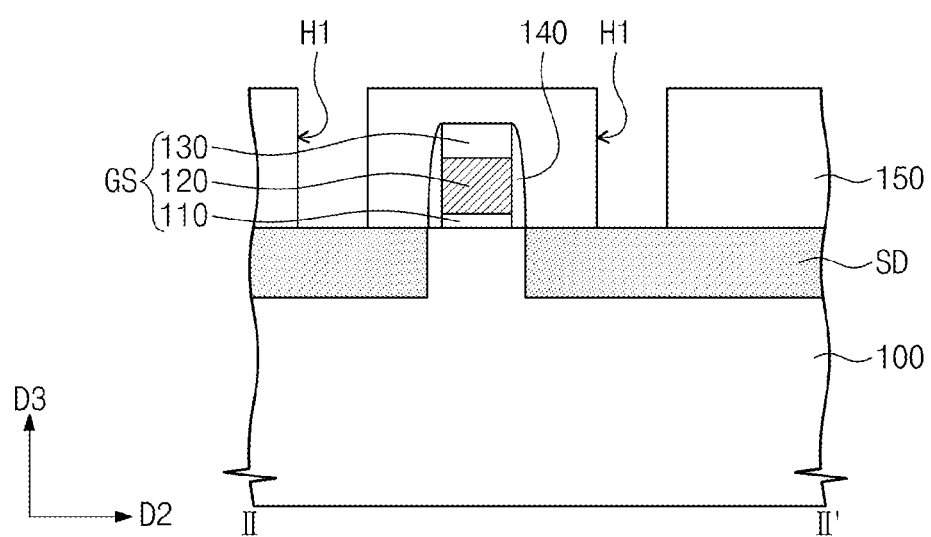
FIG. 5C is a cross-sectional view taken along a line II-II' of FIG. 5A.

In more detail, the mask may define the standard contact holes H1 and the first and second modified contact holes H2 and H3 which will be formed on the substrate 100 (refer to FIGS. 5A, 5B, and 5C). Here, in the process of fabricating the mask, a mask pattern that defines the first modified contact hole H2 having a greater area and a smaller spacing distance than the standard contact hole H1 (A1>A0, S1<S0) may be formed (on a blank of the mask) by means of the first marker MA1. A mask pattern that defines the second modified contact hole H3 having a smaller area and a greater spacing distance than the standard contact hole H1 (A2<A0, S2>S0) may be formed (on the blank) by means of the second marker MA2. Even though not shown in the drawings, an optical proximity correction process may be additionally performed in the fabricating of the mask. When the optical proximity correction process is performed, mask patterns defining the standard contact holes H1 may be converted into the mask patterns defining the first and second modified contact holes H2 and H3 on the mask.

A patterning process using the mask may be performed to form the standard contact holes H1, the first modified contact hole H2, and the second modified contact hole H3 which penetrate the first interlayer insulating layer 150. The standard contact holes H1, the first modified contact hole H2, and the second modified contact hole H3 may expose portions of top surfaces of the source/drain regions SD.

The standard contact holes H1 may be spaced apart from each other with the gate structure GS interposed therebetween. In other words, the standard contact holes H1 may be spaced apart from each other in the second direction D2. Each of the standard contact holes H1 may be spaced apart from the gate structure GS by the standard distance S0 in the second direction D2. Each of the standard contact holes H1 may have the standard area A0. The standard area A0 may correspond to an area of the standard contact hole H1 when viewed from above, i.e., in plan. Even though not shown in the drawings, a plurality of the standard contact holes H1 may be provided at one side of the gate structure GS, as arranged alongside one sidewall surface of the gate structure GS in the first direction D1.

The first modified contact hole H2 may be formed at one side of the gate structure GS. The first modified contact hole H2 may be spaced apart from the gate structure GS by the first distance S1 in the second direction D2. The first distance S1 may be smaller than the standard distance S0. The first modified contact hole H2 may have the first area A1. The first area A1 may correspond to an area of the first modified contact hole H2 when viewed from above, i.e., in plan. The first area A1 may be greater than the standard area A0. Even though not shown in the drawings, a plurality of the first modified contact holes H2 may be formed, as arranged alongside one sidewall surface of the gate structure GS in the first direction D1.

The second modified contact hole H3 may be formed at the other side of the gate structure GS. The second modified contact hole H3 may be spaced apart from the first modified contact hole H2 in the second direction D2 with the gate structure GS interposed therebetween. The second modified contact hole H3 may be spaced apart from the gate structure GS by the second distance S2 in the second direction D2. The second distance S2 may be greater than the standard distance S0. The second modified contact hole H3 may have the second area A2. The second area A2 may correspond to an area of the second modified contact hole H3 when viewed from above, i.e., in plan. The second area A2 may be smaller than the standard area A0. Even though not shown in the drawings, a plurality of the second modified contact holes H3 may be formed, as arranged alongside one sidewall surface of the gate structure GS in the first direction D1.

Performing the patterning process may include forming a photoresist layer (not shown) on the first interlayer insulating layer 150, performing an exposure process using the mask on the photoresist layer to form a photoresist pattern (not shown) that has standard openings defining standard contact holes H1 and first and second modified openings defining the first and second modified contact holes H2 and H3, etching the first interlayer insulating layer 150 exposed by the standard openings and the first and second modified openings, and removing the photoresist pattern.

Referring again to FIGS. 1A to 1C, a conductive layer may be formed on the first interlayer insulating layer 150 to fill the standard contact holes H1 and the first and second modified contact holes H2 and H3. The conductive layer may include at least one of a doped semiconductor, a metal, and a conductive metal nitride. The conductive layer may be planarized until the first interlayer insulating layer 150 is exposed, thereby forming the contacts CA, CA1, and CA2 locally in the contact holes H1, H2, and H3. The contacts CA, CA1, and CA2 may include standard contacts CA formed in the standard contact holes H1, a first modified contact CA1 formed in the first modified contact hole H2, and a second modified contact CA2 formed in the second modified contact hole H3. Due to the planarization process, top surfaces of the contacts CA, CA1, and CA2 may be substantially coplanar with a top surface of the first interlayer insulating layer 150.

The standard contacts CA may penetrate the first interlayer insulating layer 150 so as to be connected to the source/drain regions SD at both sides of the gate structure GS. In an embodiment, the standard contacts CA may have bar shapes extending in the first direction D1 when viewed from above, i.e., in plan. Each of the standard contacts CA may have a standard width W0 in the second direction D2 and a standard length L0 in the first direction D1.

The first modified contact CA1 may penetrate the first interlayer insulating layer 150 so as to be connected to the source/drain region SD at one side of the gate structure GS. In an embodiment, the first modified contact CA1 may have a bar shape extending in the first direction D1 when viewed from above, i.e., in plan. The first modified contact CA1 may have a first width W1 in the second direction D2 and a first length L1 in the first direction D1. The first width W1 may be greater than or equal to the standard width W0. The first length L1 may be greater than or equal to the standard length L0.

The second modified contact CA2 may penetrate the first interlayer insulating layer 150 so as to be connected to the source/drain region SD at another side of the gate structure GS. In an embodiment, the second modified contact CA2 may have a bar shape extending in the first direction D1 when viewed from above, i.e., in plan. The second modified contact CA2 may have a second width W2 in the second direction D2 and a second length L2 in the first direction D1. The second width W2 may be smaller than or equal to the standard width W0. The second length L2 may be smaller than or equal to the standard length L0.

Even though not shown in the drawings, a gate contact may be formed on the gate structure GS. The gate contact may be electrically connected to the gate electrode 120. A top surface of the gate contact and the top surfaces of the contacts CA, CA1, and CA2 may be disposed at substantially the same level, i.e., at substantially the same distances as one another from an upper surface of the substrate 100. The gate contact may include the same material as the contacts CA, CA1, and CA2. In addition, interconnections (not shown) electrically connected to the contacts CA, CA1, and CA2 and the gate contact may be provided on the substrate 100. The interconnections may be electrically connected to the source/drain regions SD and the gate electrode 120 through the contacts CA, CA1, and CA2 and the gate contact. Predetermined voltages may be applied to the source/drain regions SD and the gate electrode 120 through the interconnections. In an embodiment, the interconnections may include a power node supplied with a power voltage, and an output node outputting a signal processed by a circuit.

Figure 7:
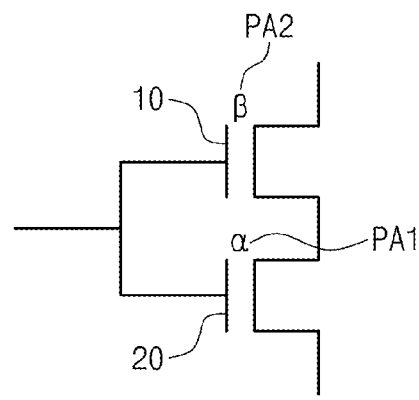
FIG. 7 is a schematic used in a method of manufacturing a semiconductor device according to an embodiment of the inventive concepts.
Figure 8:
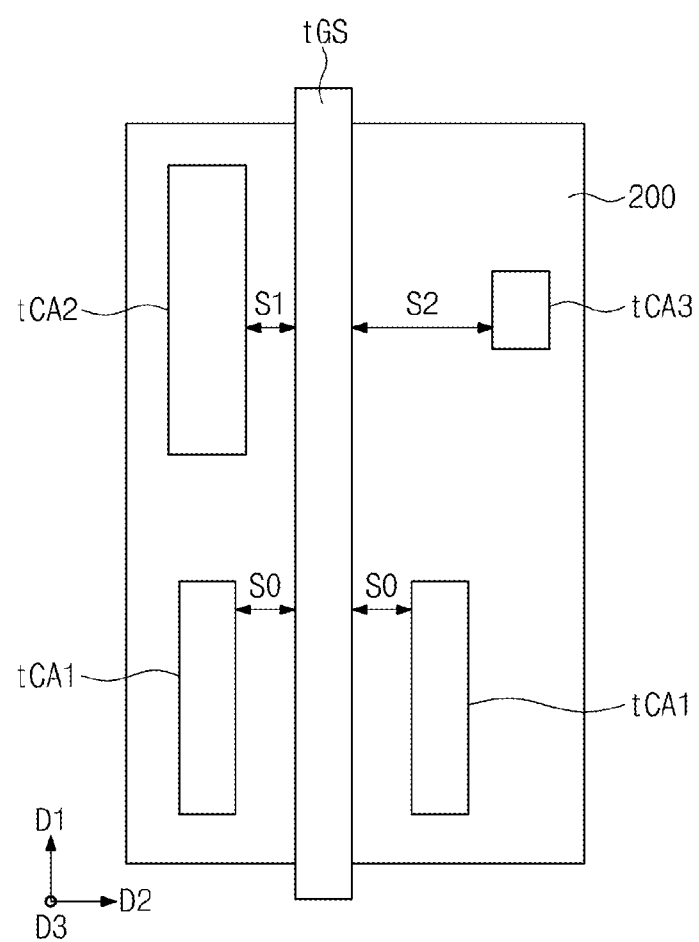
FIG. 8 is diagram of a layout, derived from the schematic of FIG. 7, used in a method of manufacturing a semiconductor device according to an embodiment of the inventive concepts.

FIG. 7 illustrates the process of designing a schematic in the method of manufacturing a semiconductor device according to the inventive concepts. FIG. 7 also shows that the annotating process may be carried out in the designing of the schematic, instead of in the making of the layout as described with reference to FIG. 6. FIG. 8 thus illustrates a process of making the layout of a semiconductor device derived using the schematic of FIG. 7, as an alternative to the annotated layout shown in FIG. 6.

Referring to FIG. 7, the schematic may represent a semiconductor device including a first transistor 10 and a second transistor 20 that are connected in series to each other. Gates of the first and second transistors 10 and 20 may be connected to each other to constitute one common gate. In an embodiment, a source and a drain of the first transistor 10 may be connected to a power node and an output node, respectively. Here, the first and second modified contacts CA1 and CA2 described with reference to FIGS. 1A to 1C may be formed on the first transistor 10 to reduce a resistance of the first transistor 10 and a voltage drop. To form the modified contacts CA1 and CA2, the schematic may be annotated with symbols α and μ corresponding to parameters PA1 and PA2, respectively. The symbol α (PA1) may indicate that the standard contacts CA are to be provided for (connected to the source/drain of) the second transistor 20 as well as the size of the second transistor 20. The symbol β (PA2) may indicate that the first and second modified contacts CA1 and CA2 are to be provided for first transistor 10.

Referring to FIG. 8, a gate layout tGS and contact-hole layouts tCA1, tCA2, and tCA3 may be disposed on a layout plate 200. The contact-hole layouts tCA1, tCA2, and tCA3 may include standard contact-hole layouts tCA1 and first and second modified contact-hole layouts tCA2 and tCA3. As mentioned above, the layout may be made according to the schematic of FIG. 7 annotated with the parameters PA1 and PA2. Thus, a portion of the layout, which corresponds to the first transistor 10, may be made to have the first and second modified contact-hole layouts tCA2 and tCA3.

Unlike the layout described with reference to FIG. 6, the layout of FIG. 8 may correspond to the plan view of FIG. 5A. In other words, the standard contact-hole layouts tCA1 and the first and second modified contact-hole layouts tCA2 and tCA3 may correspond to the standard contact holes H1 and the first and second modified contact holes H2 and H3, respectively.

Subsequently, the semiconductor device according to an embodiment may be realized using the physical processes shown in and described with reference to FIGS. 3A to 5A, 3B to 5B, and 5C.

Second Embodiment

Figure 9:
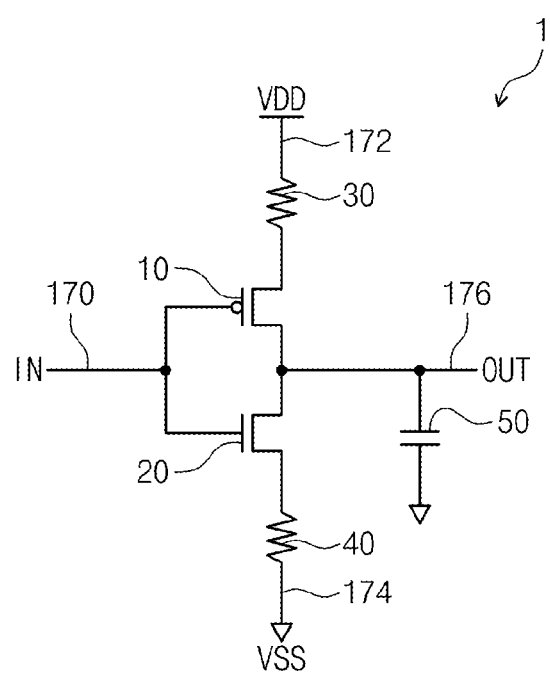
FIG. 9 is a schematic diagram of a semiconductor device comprising an inverter according to an embodiment of the inventive concepts.

FIG. 9 is a schematic illustrating an inverter in a semiconductor device according to an embodiment of the inventive concepts.

Referring to FIG. 9, a semiconductor device according to the present embodiment may include an inverter 1 used as a logic cell. The inverter 1 may include a first transistor 10 and a second transistor 20 which are connected in series to each other. The first transistor 10 may be a P-type metal-oxide-semiconductor (PMOS) transistor, and the second transistor 20 may be an N-type MOS (NMOS) transistor. Gates of the first and second transistors 10 and 20 may be connected in common to an input node 170. A first signal IN may be inputted to the inverter 1 through the input node 170.

A source of the first transistor 10 may be connected to a first power node 172. A driving voltage VDD may be applied to the first transistor 10 through the first power node 172. A source of the second transistor 20 may be connected to a second power node 174. A ground voltage VSS may be applied to the second transistor 20 through the second power node 174.

The first power node 172 and the first transistor 10 may be connected to each other through one of first modified contacts CA1 (described in detail later). The second power node 174 and the second transistor 20 may be connected to each other through another of the first modified contacts CA1. Due to the first modified contacts CA1, a first resistance 30 may be formed between the first power node 172 and the first transistor 10 and a second resistance 40 may be formed between the second power node 174 and the second transistor 20. Here, if values of the first and second resistances 30 and 40 are low, a voltage drop (e.g., IR-DROP) may be correspondingly low to improve characteristics of the semiconductor device. To minimize the values of the first and second resistances 30 and 40, the first modified contacts CA1 may have relatively wide contact areas. This will be described later in more detail.

Drains of the first and second transistors 10 and 20 may be connected in common to an output node 176. A second signal OUT opposite to the first signal IN may be transmitted to another circuit through the output node 176.

The output node 176 may be connected to the first and second transistors 10 and 20 through second modified contacts CA2 (described in detail later). A parasitic capacitance 50 may occur between the output node 176 and the transistors 10 and 20 by the second modified contacts CA2. If a value of the parasitic capacitance 50 is lowered, a speed of the semiconductor device may be improved. To achieve this, the second modified contact CA2 may have a relatively great spacing relative to the (gate of the) transistor to which it is connected and a relatively small contact area. These aspects will be described later in more detail.

FIGS. 10A-10E illustrate a semiconductor device according to an embodiment of the inventive concepts. Hereinafter, differences between the present embodiment and the embodiment of FIGS. 1A to 1C will be mainly described to avoid redundancy of explanation. In the present embodiment, the same elements as described in the above embodiment will be indicated by the same reference numerals or the same reference designators. Also, as these figures make clear, the nodes described with reference to FIG. 9 may be realized in the form of electrically conductive strips extending on the insulating layer through which the contacts extend.

Referring to FIGS. 9 and 10A to 10E, a substrate 100 may be provided. A device isolation structure or simply "device isolation" may be formed in the substrate 100 to define active regions. The device isolation structure may include first device isolation patterns ST1 and second device isolation patterns ST2.

The active regions may include a PMOSFET region PR and an NMOSFET region NR which are isolated from each other by the first device isolation patterns ST1. The first device isolation patterns ST1 may extend in the second direction D2 parallel to the top surface of the substrate 100. The PMOSFET region PR and the NMOSFET region NR may be spaced apart from each other in the first direction D1 with the first device isolation pattern ST1 interposed therebetween. The first direction D1 may intersect the second direction D2. A plurality of each of the PMOSFET regions PR and NMOSFET regions NR may be provided, and the PMOSFET regions PR and the NMOSFET regions NR may be alternately arranged in the first direction D1.

Figure 10A:
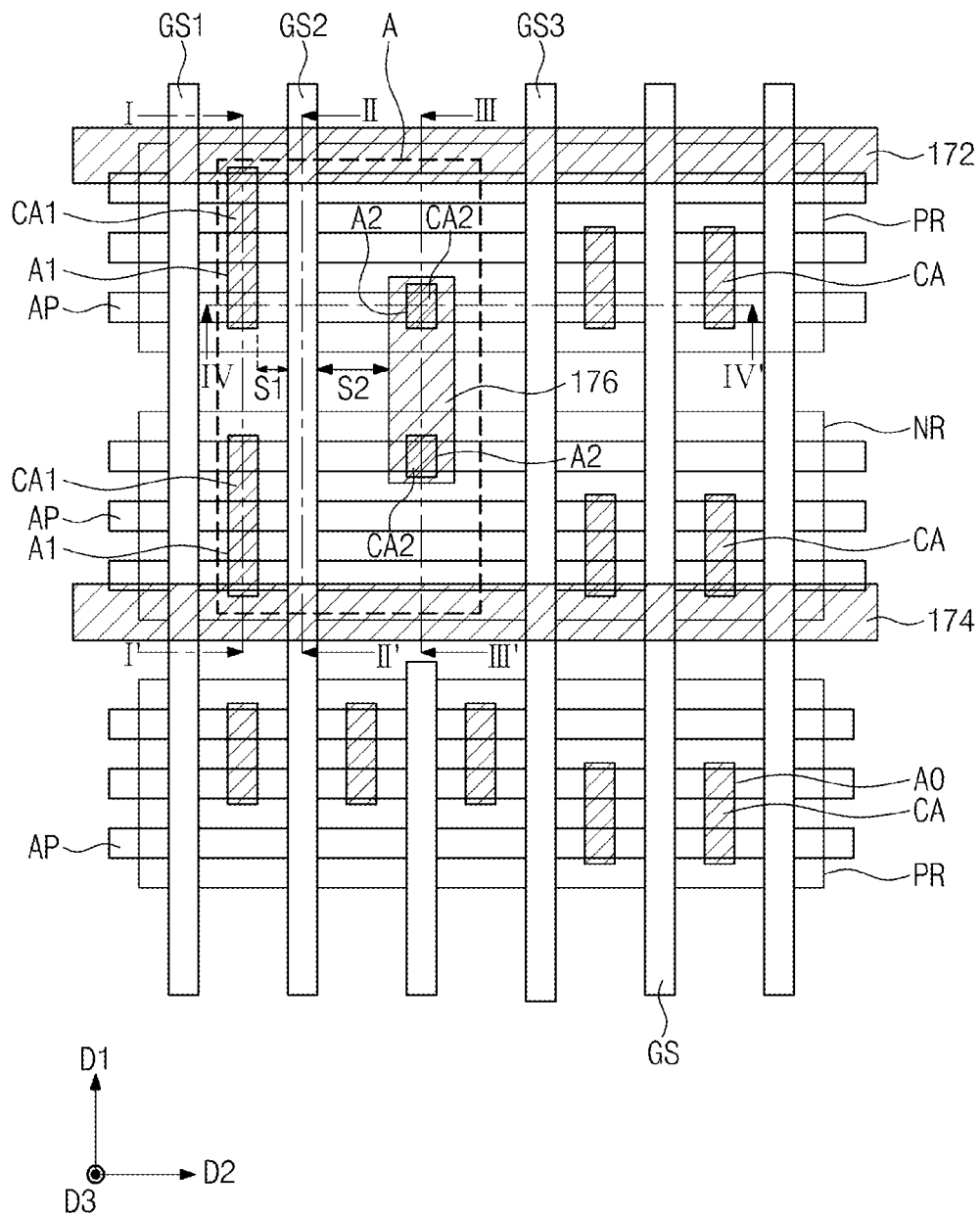
FIG. 10A is a plan view of a semiconductor device according to an embodiment of the inventive concepts.
Figure 10B:
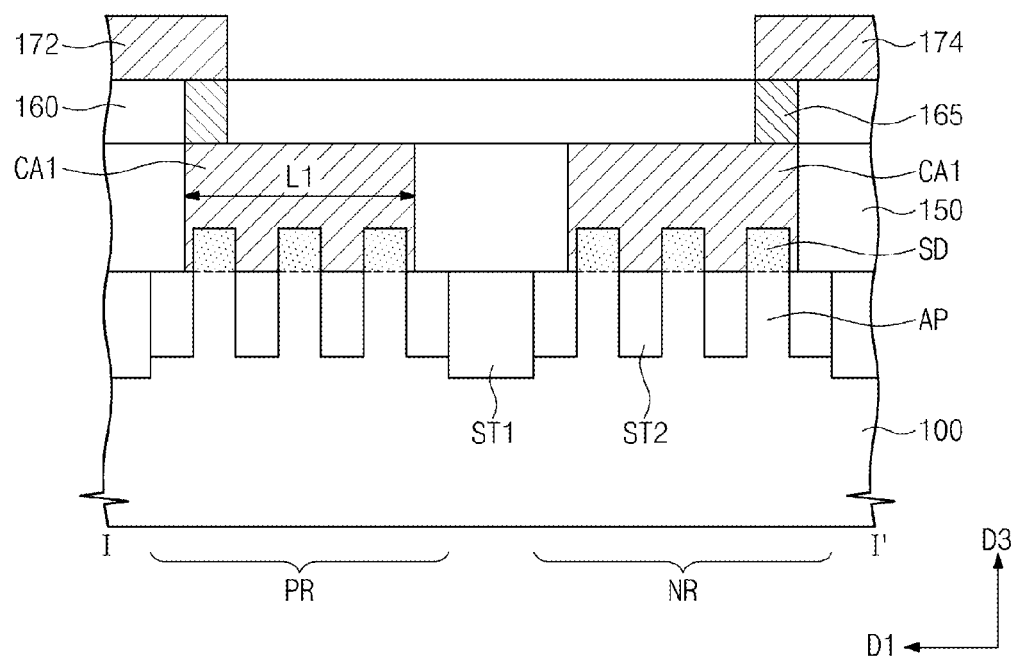
FIG. 10B is a cross-sectional view taken along line I-I' of FIG. 10A.
Figure 10C:
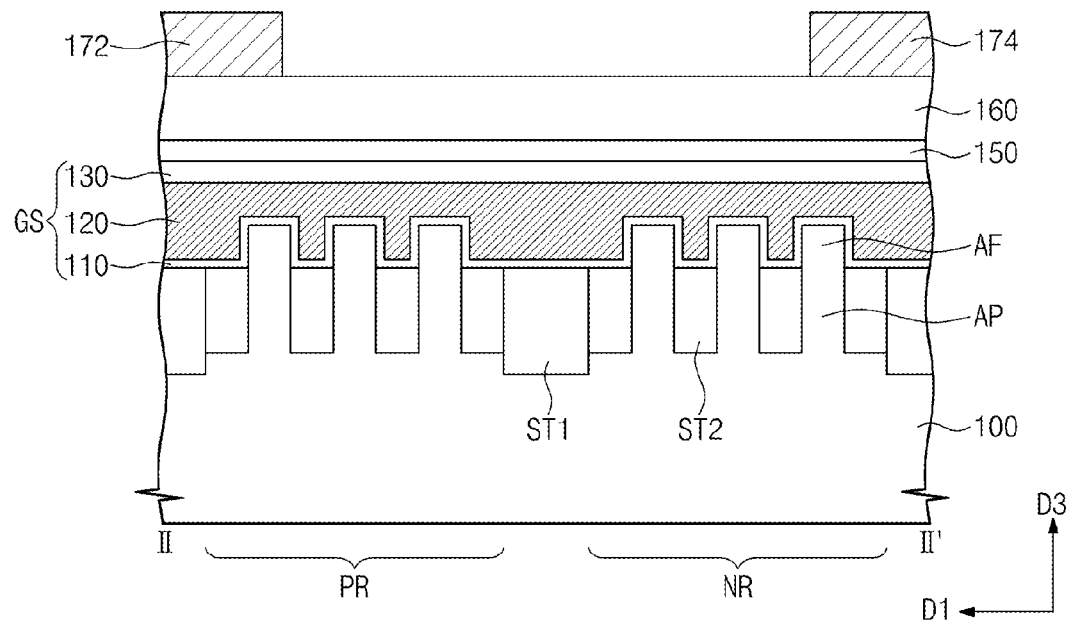
FIG. 10C is a cross-sectional view taken along line II-II' of FIG. 10A.
Figure 10D:
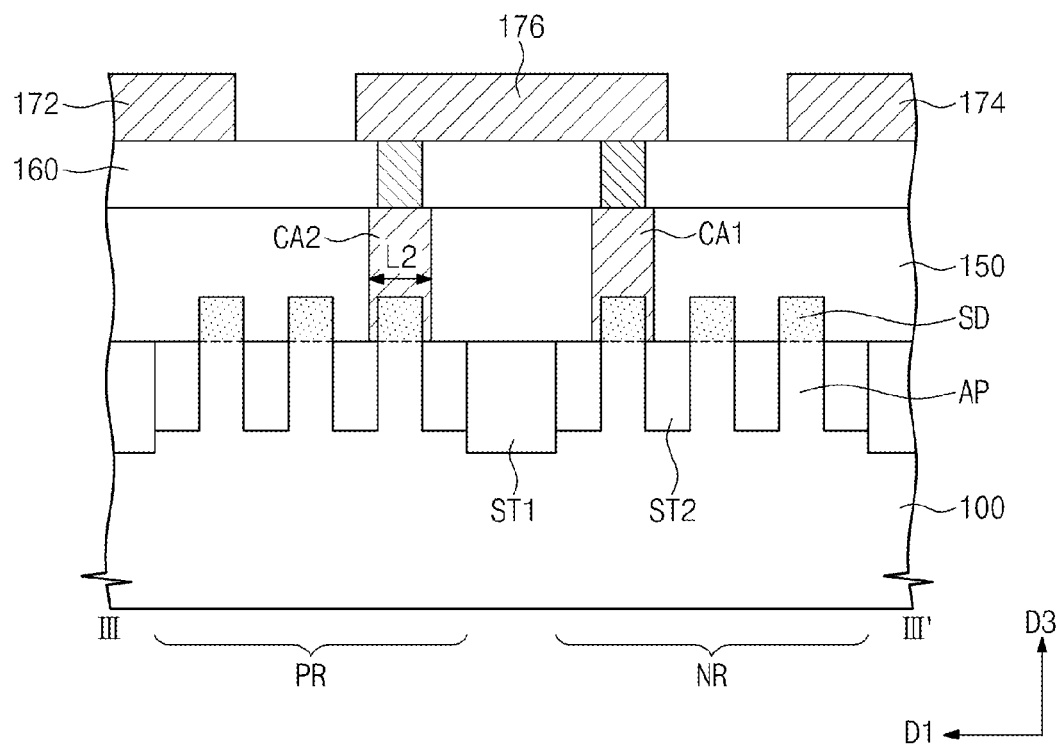
FIG. 10D is a cross-sectional view taken along line III-III' of FIG. 10A.
Figure 10E:
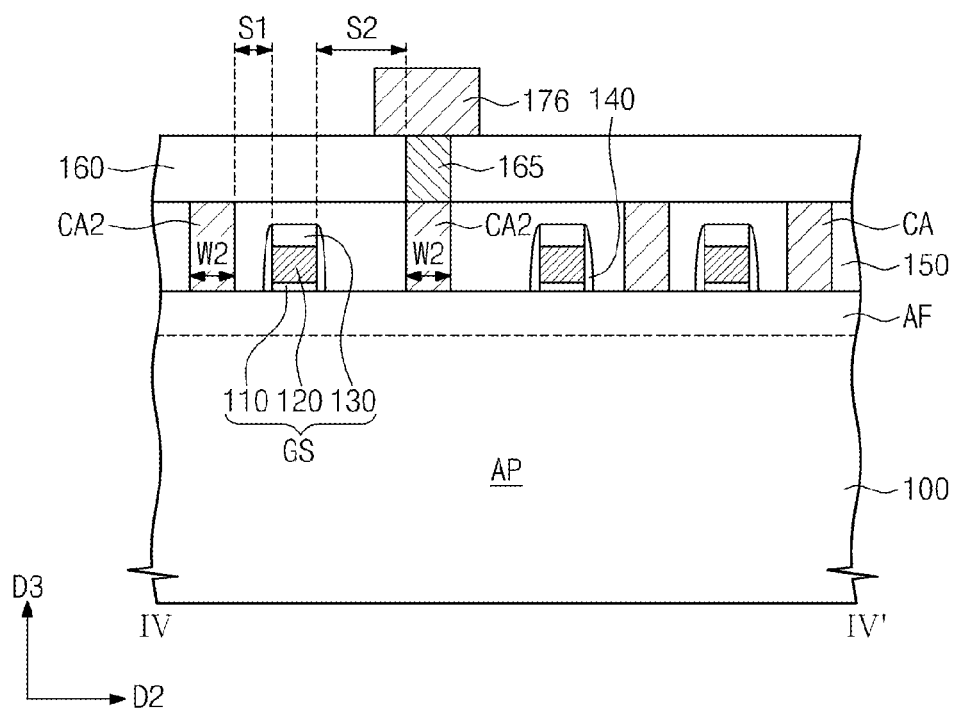
FIG. 10E is a cross-sectional view taken along line IV-IV' of FIG. 10A.

The second device isolation patterns ST2 may define active patterns AP in the PMOSFET and NMOSFET regions PR and NR. The second device isolation patterns ST2 may extend in the second direction D2 such that the active patterns AP may extend in the second direction D2 and may be spaced apart from each other in the first direction D1. Each of the active patterns AP may have an upper portion (hereinafter, referred to as 'an active fin AF') that is exposed by the second device isolation patterns ST2. The active patterns AP may be provided on the PMOSFET region PR and the NMOSFET region NR. In FIG. 10A, three active patterns AP may be defined in each of the PMOSFET and NMOSFET regions PR and NR. However, the inventive concepts are not limited thereto.

Each of the device isolation patterns ST1 and ST2 may have a depth in a direction opposite to a third direction D3. The third direction D3 may be perpendicular to the first and second directions D1 and D2 and hence, may be perpendicular to the top surface of the substrate 100. In an embodiment, the depths of the second device isolation patterns ST2 may be smaller than those of the first device isolation patterns ST1. In another embodiment, the depths of the second device isolation patterns ST2 may be substantially equal to those of the first device isolation patterns ST1.

Gate structures GS disposed on the substrate 100 may intersect the active patterns AP. The gate structures GS may extend in the first direction D1. Each of the gate structures GS may include a gate insulating pattern 110, a gate electrode 120, and a capping pattern 130 which are sequentially stacked on the substrate 100. Gate spacers 140 may be formed on both sidewall surfaces of each of the gate structures GS.

The gate structures GS may be spaced apart from each other in the second direction D2. Distances between the gate structures GS may not be equal to each other. In an embodiment, the gate structures GS may include first, second, and third gate structures GS1, GS2, and GS3. In this example, the distance between the first and second gate structures GS1 and GS2 may be smaller than the distance between the second and third gate structures GS2 and GS3. The distance between the second and third gate structures GS2 and GS3 may range from 1.5 times to 2.5 times the distance between the first and second gate structures GS1 and GS2.

Source/drain regions SD may be disposed at both sides of each of the gate structures GS. In some embodiments, the source/drain regions SD may be formed in the active fins AF at both sides of the gate structure GS by means of an ion implantation process. Portions of the active fins AF, which vertically overlap the gate structures GS, may be used as channel regions of field effect transistors.

In other embodiments, the source/drain regions SD may include a semiconductor element different from that of the substrate 100. In this case, the active fins AF may be removed from both sides of the gate structure GS, and the source/drain regions SD may be formed on the active patterns AP at both sides of the gate structure GS by a selective epitaxial growth (SEG) process. For example, the source/drain regions SD may include a semiconductor element whose lattice constant is greater or smaller than that of the semiconductor element of the substrate 100. Since the source/drain regions SD include a semiconductor element different from that of the substrate 100, they may apply compressive force or tensile force to the channel regions (i.e., the portions of the active fins AF disposed under the gate structures GS). In an embodiment, the substrate 100 may be a silicon substrate and the source/drain regions SD may include silicon-germanium or germanium. In this case, the source/drain regions SD may apply a compressive force to the channel regions, and the field effect transistor including the source/drain regions SD may be a PMOS transistor. In another embodiment, the substrate 100 may be a silicon substrate and the source/drain regions SD may include silicon carbide (SiC). In this case, the source/drain regions SD may apply a tensile force to the channel regions, and the field effect transistor including the source/drain regions may be an NMOS transistor. Since the source/drain regions SD provide the compressive force or the tensile force to the channel regions, mobility of carriers generated in the channel regions may be improved when the field effect transistors according to the inventive concepts are operated.

A first interlayer insulating layer 150 may be formed on the substrate 100 to cover the gate structures GS. The first interlayer insulating layer 150 may include at least one of a silicon oxide layer and a silicon oxynitride layer.

Contacts CA, CA1, and CA2 may be disposed on the substrate 100. The contacts CA, CA1, and CA2 may penetrate the first interlayer insulating layer 150 so as to be in contact with the source/drain regions SD. The contacts CA, CA1, and CA2 may be disposed at both sides of each of the gate structures GS. The contacts disposed at each side of the gate structure GS may be arranged in the first direction D1. The contacts CA, CA1, and CA2 may have bar shapes extending in the first direction D1. In addition, top surfaces of the contacts CA, CA1, and CA2 may be disposed at the substantially same level, i.e., at the same distance from the top surface of the substrate 100. The contacts CA, CA1, and CA2 may include standard contacts CA, first modified contacts CA1, and second modified contacts CA2.

The standard contacts CA may be spaced apart from each other with at least one gate structure GS interposed therebetween. Each of the standard contacts CA may have a standard area A0 when viewed from above, i.e., in plan. In an embodiment, one standard contact CA may be in direct contact with two source/drain regions SD.

The first modified contacts CA1 may be disposed at one side of at least one of the gate structures GS. In the present embodiment, the first modified contacts CA1 may be disposed between the first and second gate structures GS1 and GS2. The first modified contacts CA1 may be spaced apart from the second gate structure GS2 by a first distance S1 in the second direction D2. Each of the first modified contacts CA1 may have a first area A1. The first area A1 may be greater than the standard area A0. In an embodiment, one of the first modified contacts CA1 may be in direct contact with three source/drain regions SD. In addition, each of the first modified contacts CA1 may have a first width W1 in the second direction D2 and a first length L1 in the first direction D1.

The second modified contacts CA2 may be disposed at another side of the at least one of the gate structures GS. In the present embodiment, the second modified contacts CA2 may be disposed between the second and third gate structures GS2 and GS3. In other words, the second modified contact CA2 may be spaced apart from the first modified contact CA1 with the second gate structure GS2 interposed therebetween. The second modified contacts CA2 may be spaced apart from the second gate structure GS2 by a second distance S2 in the second direction D2. The second distance S2 may be greater than the first standard distance S1. In an embodiment, the second distance S2 may range from 1.5 times to 2.5 times the first distance S1. As described above, since the distance between the second and third gate structures GS2 and GS3 is relatively great, the second distance S2 by which the second modified contacts CA2 are spaced apart from the second gate structure GS2 is relatively great.

Each of the second modified contacts CA2 may have a second area A2. The second area A2 may be smaller than the standard area A0. In an embodiment, one of the second modified contacts CA2 may be in direct contact with one source/drain region SD. Each of the second modified contacts CA2 may have a second width W2 in the second direction D2 and a second length L2 in the first direction D1. The second width W2 may be smaller than or equal to the first width W1. The second length L2 may be smaller than the first length L1.

Even though not shown in the drawings, gate contacts electrically connected to the gate electrodes 120 may be disposed on the gate structures GS.

A second interlayer insulating layer 160 may be disposed on the first interlayer insulating layer 150 and the contacts CA, CA1, and CA2. The second interlayer insulating layer 160 may include at least one of a silicon oxide layer and a silicon oxynitride layer. Plugs 165 may penetrate the second interlayer insulating layer 160 so as to be in contact with the contacts CA, CA1, and CA2 and the gate contacts.

Interconnections 172, 174, and 176 electrically connected to the contacts CA, CA1, and CA2 and the gate contacts may be provided on the second interlayer insulating layer 160. The contacts CA, CA1, and CA2 and the gate contacts may be electrically connected to the interconnections 172, 174, and 176 through the plugs 165. In an embodiment, the interconnections 172, 174, and 176 may include a first power node 172, a second power node 174, and an output node 176. In the present embodiment, the first modified contact CA1 of the PMOSFET region PR may be connected to the first power node 172 which is supplied with a driving voltage VDD, and the first modified contact CA1 of the NMOSFET region NR may be connected to the second power node 174 which is supplied with a ground voltage VSS. The second modified contacts CA2 of the PMOSFET and NMOSFET regions PR and NR may be connected in common to one output node 176 which outputs a signal processed by a circuit. The output node 176 may be electrically connected to the gate contact, which is electrically connected to one gate electrode 120, through additional interconnections.

A region 'A' shown in FIG. 10A may correspond to the inverter 1 described with reference to FIG. 9. In the region 'A', the second gate structure GS2, the active patterns AP and the source/drain regions SD of the PMOSFET region PR may constitute the first transistor 10. In the region 'A', the second gate structure GS2, the active patterns AP and the source/drain regions SD of the NMOSFET region NR may constitute the second transistor 20.

Since each of the first modified contacts CA1 has the first area A1 which is relatively wide, the values of the first and second resistances 30 and 40 may be relatively low. In other words, the voltage drop (IR-DROP) may be reduced to improve characteristics of the semiconductor device. In addition, the second modified contacts CA2 are spaced relatively great distances from the gate structure (i.e., the second distance S2). Accordingly, the value of the parasitic capacitance 50 may be minimized. This may translate into an improved operating speed of the semiconductor device.

FIGS. 11A to 14E illustrating a method of manufacturing a semiconductor device according to an embodiment of the inventive concepts. Hereinafter, differences between the present embodiment and the embodiment of FIGS. 1A to 6 will be mainly described to avoid redundancy. The same elements as described in the aforementioned embodiment will be indicated by the same reference numerals or the same reference designators.

Figure 11A:
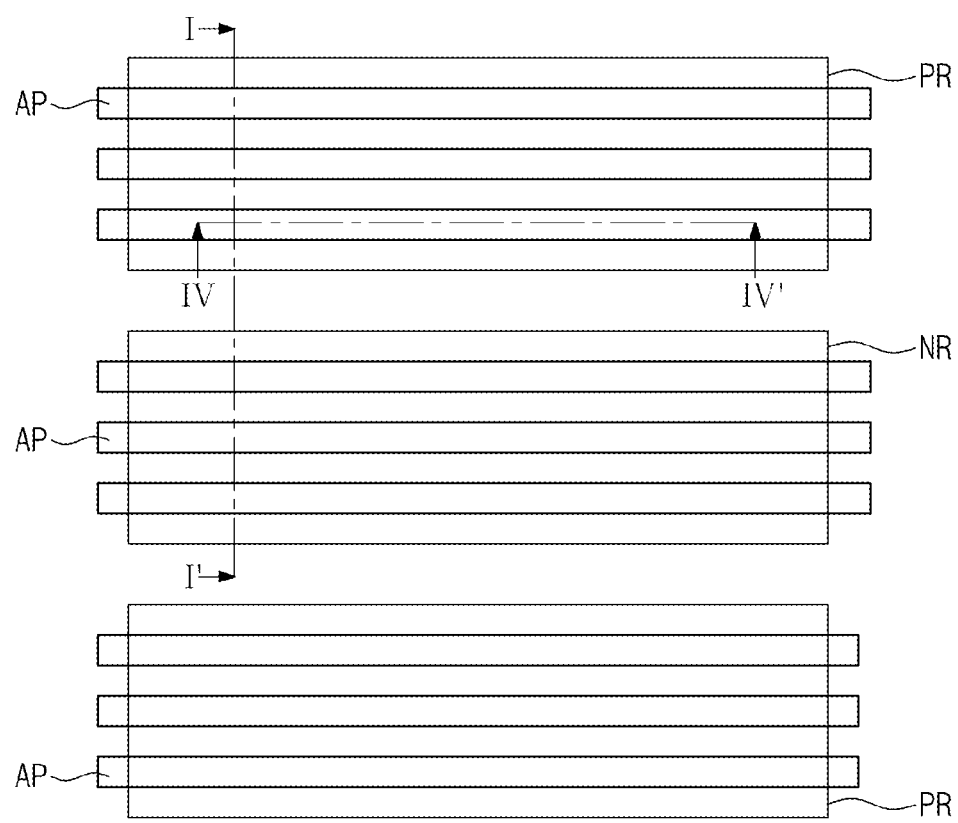
FIGS. 11A, 12A, 13A and 14A are plan views illustrating a method for manufacturing a semiconductor device according to an embodiment of the inventive concepts.
Figure 11A:
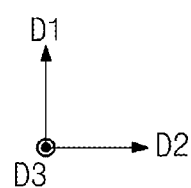
Figure 11B:
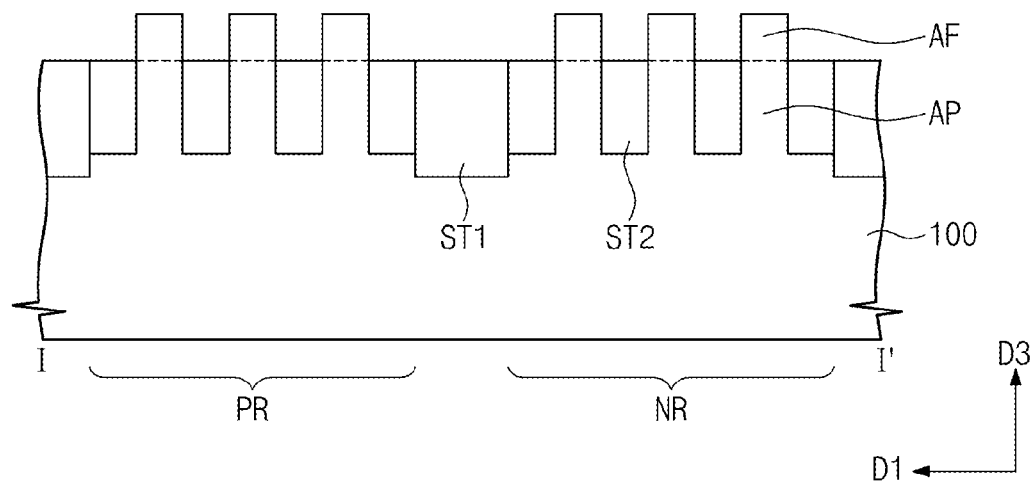
FIGS. 11B, 12B, 13B and 14B are cross-sectional views taken along lines I-I' of FIGS. 11A, 12A, 13A and 14A, respectively.
Figure 11C:
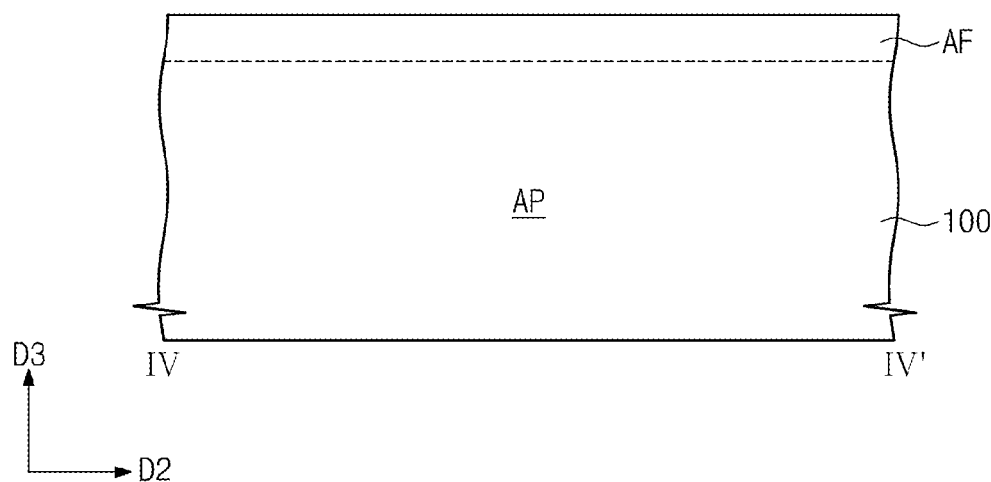
FIGS. 11C, 12D, 13D, and 14E are cross-sectional views taken along lines IV-IV' of FIGS. 11A, 12A, 13A and 14A, respectively.
Figure 12A:
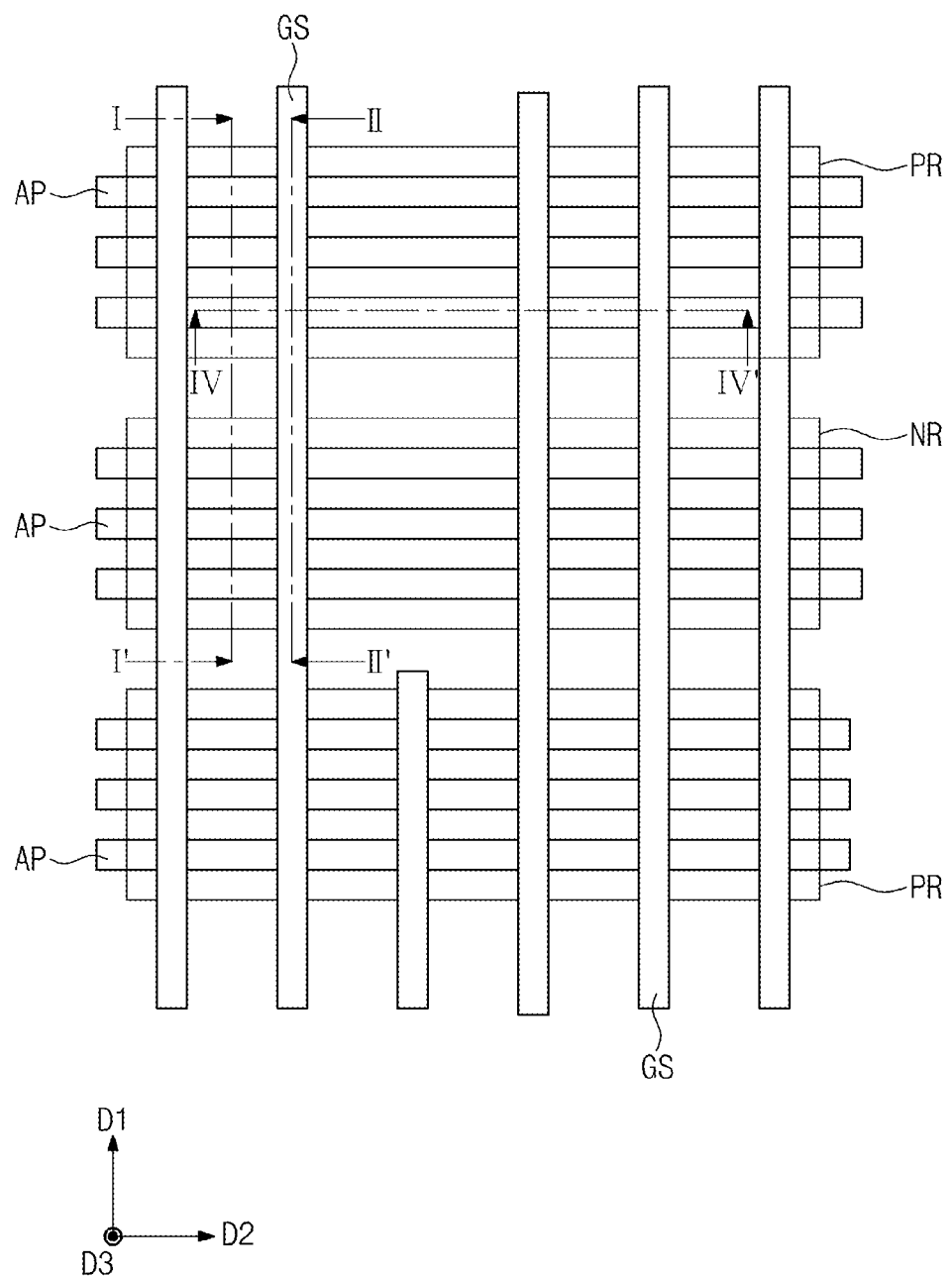
Figure 12B:
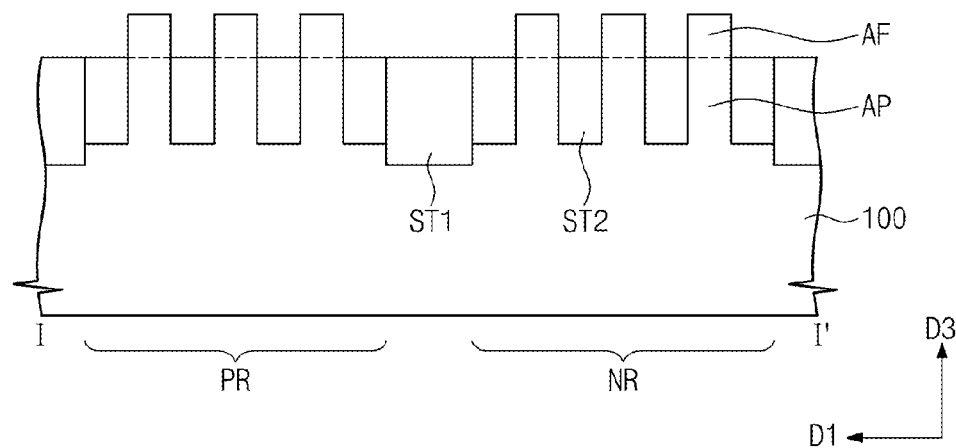
Figure 12C:
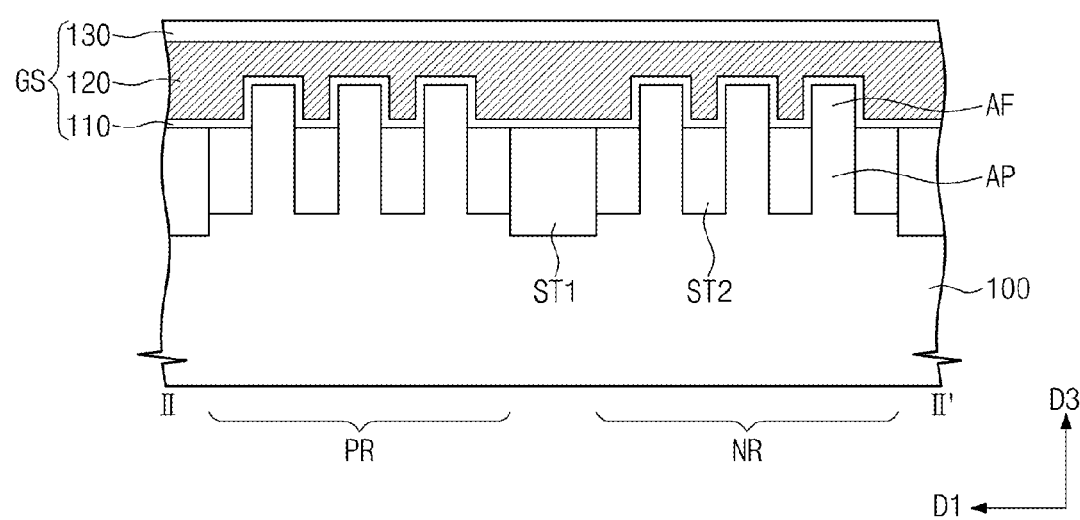
FIGS. 12C, 13C and 14C are cross-sectional views taken along lines II-II' of FIGS. 12A, 13A and 14A, respectively.
Figure 12D:
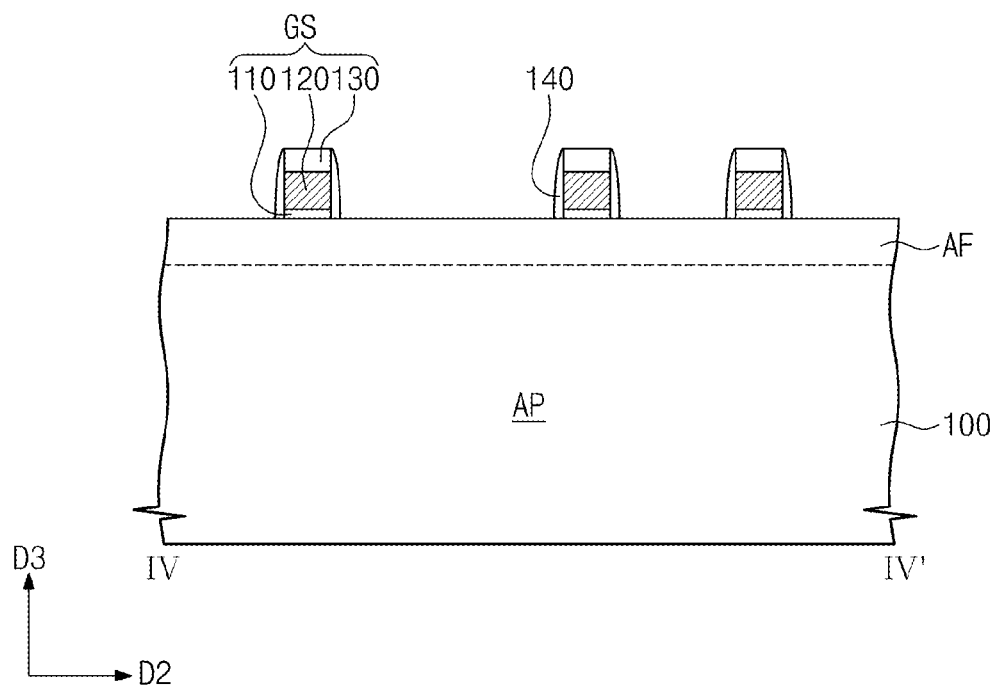
Figure 13A:
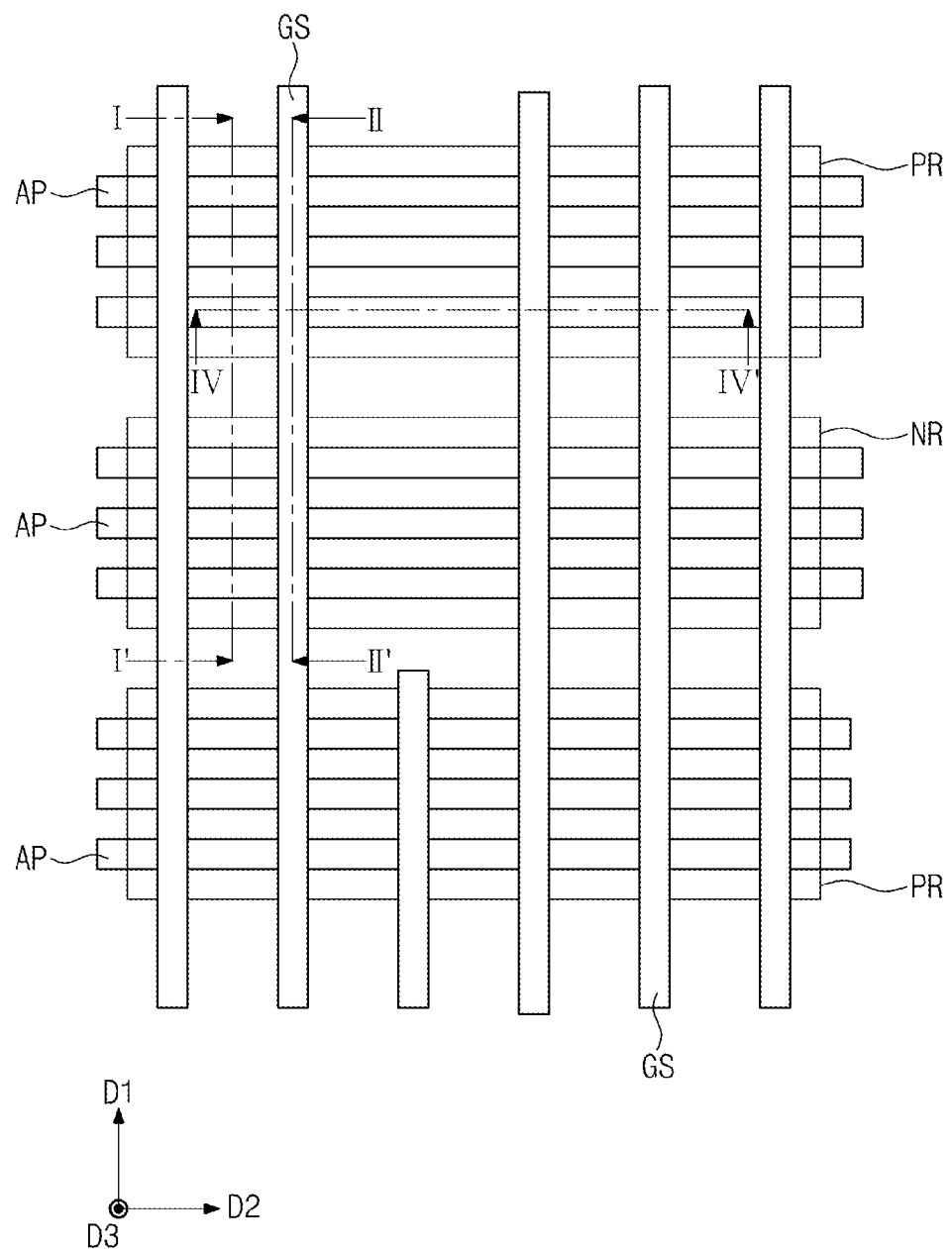
Figure 13B:
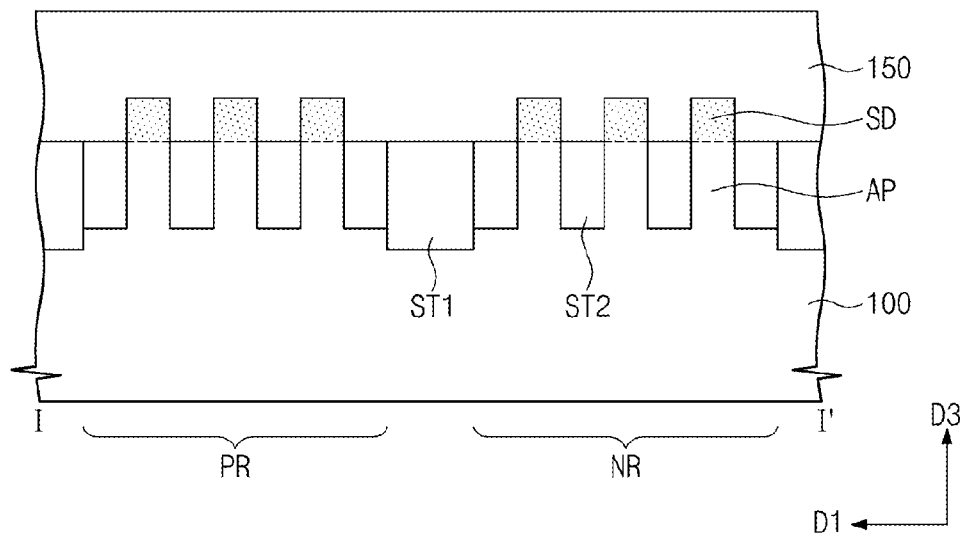
Figure 13C:
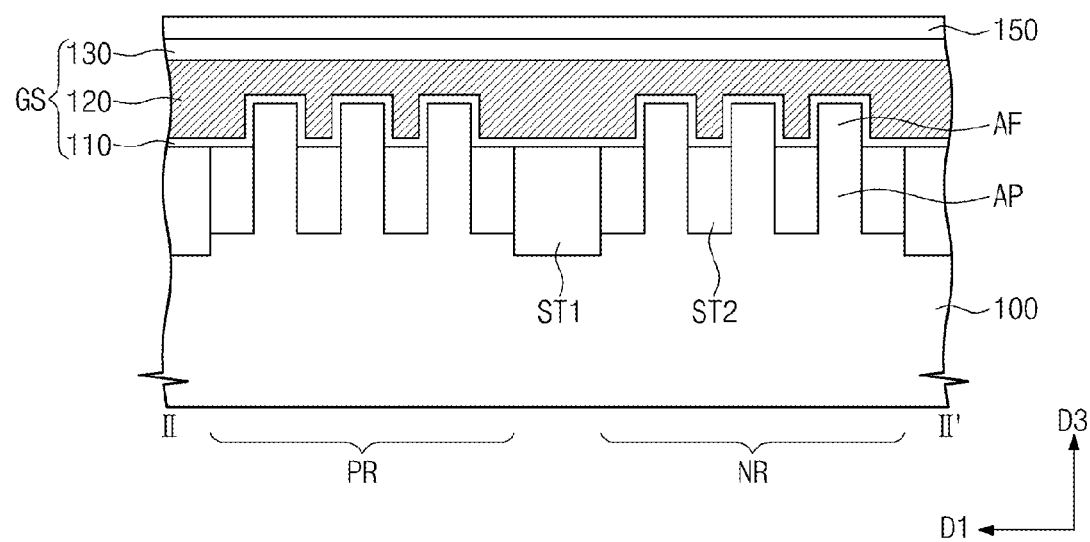
Figure 13D:
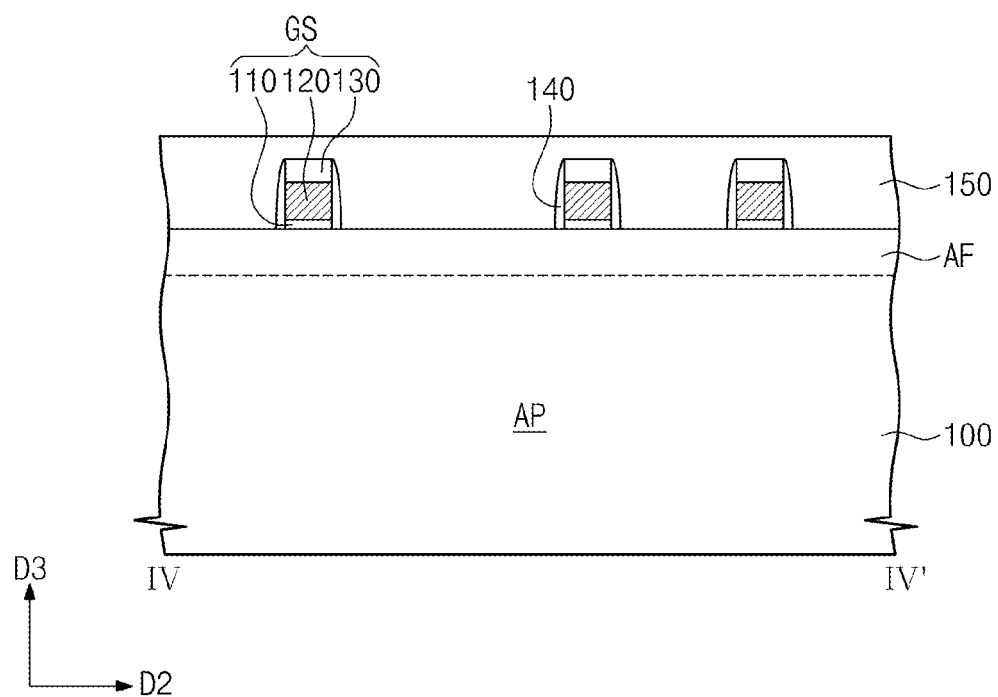
Figure 14A:
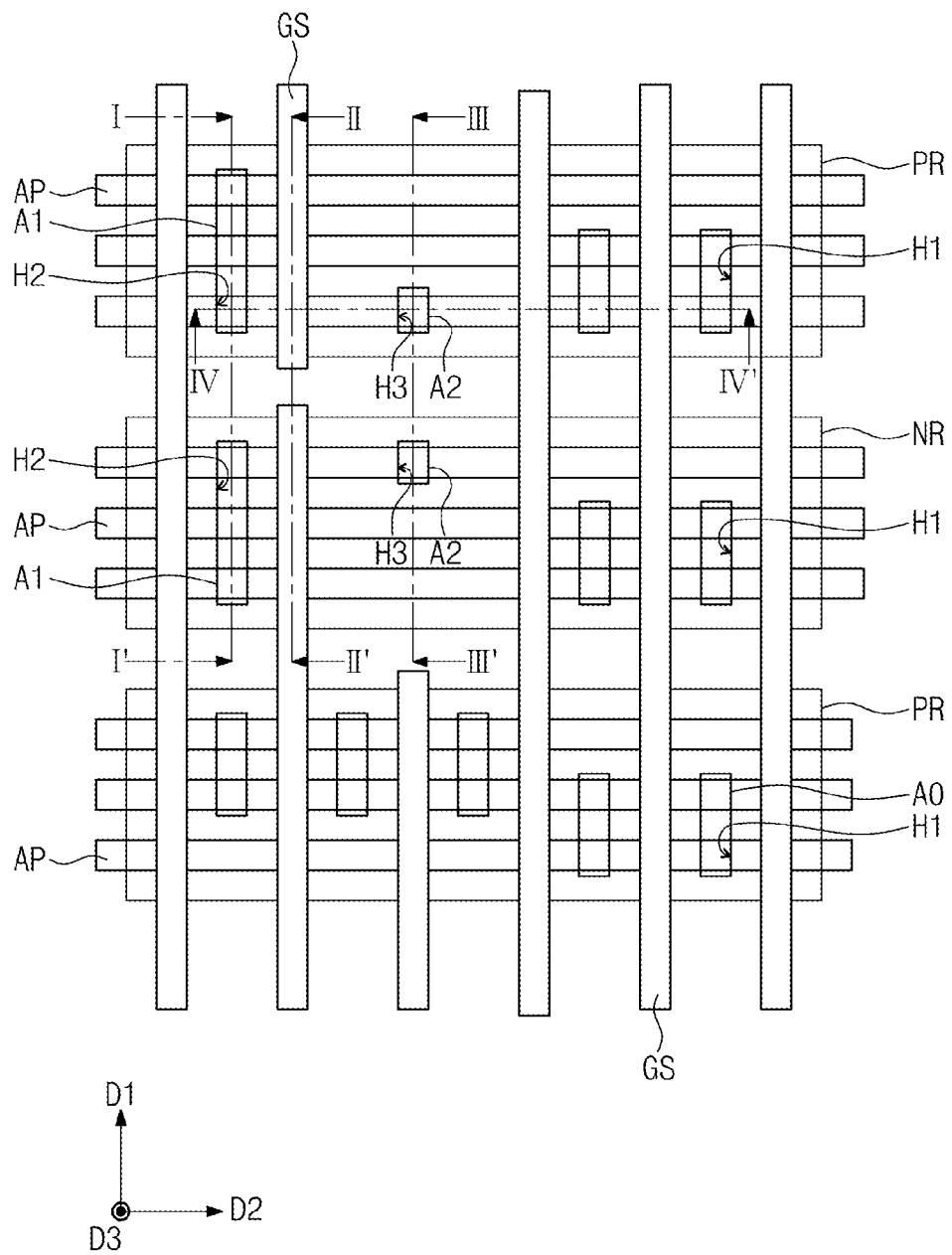
Figure 14B:
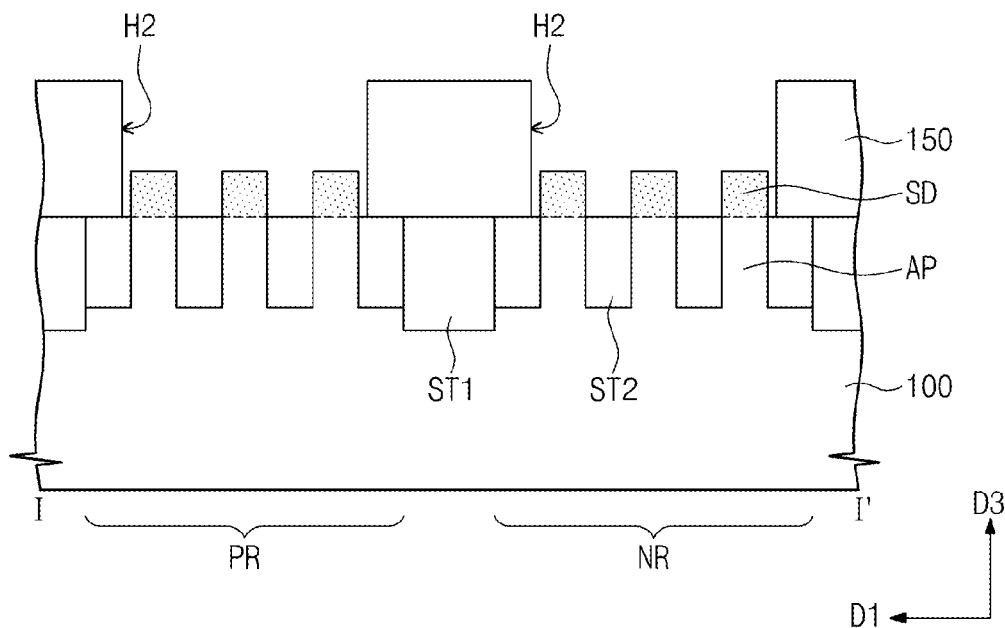
Figure 14C:
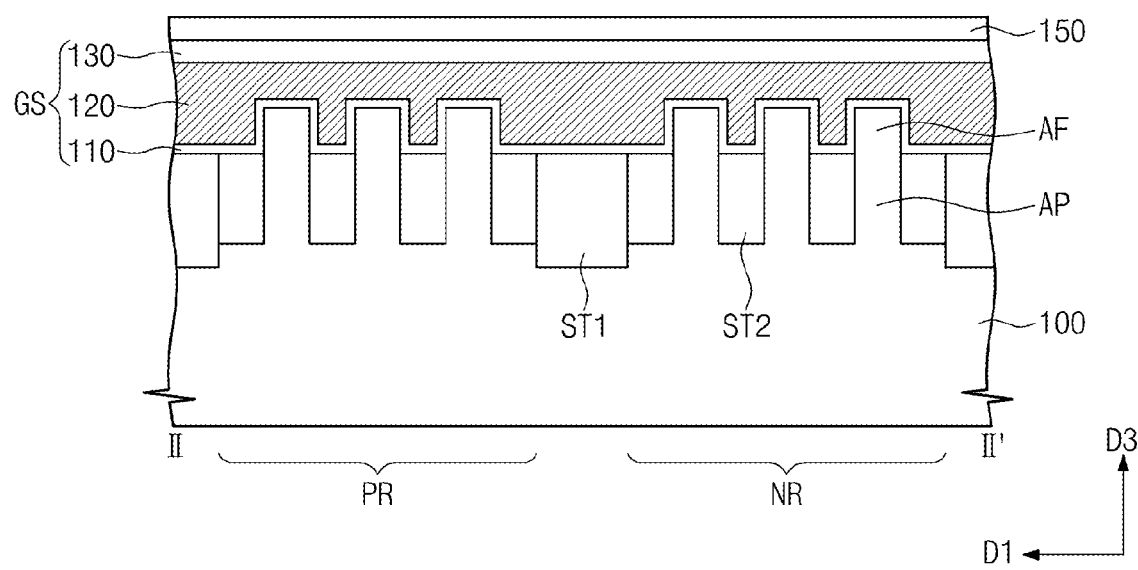
Figure 14D:
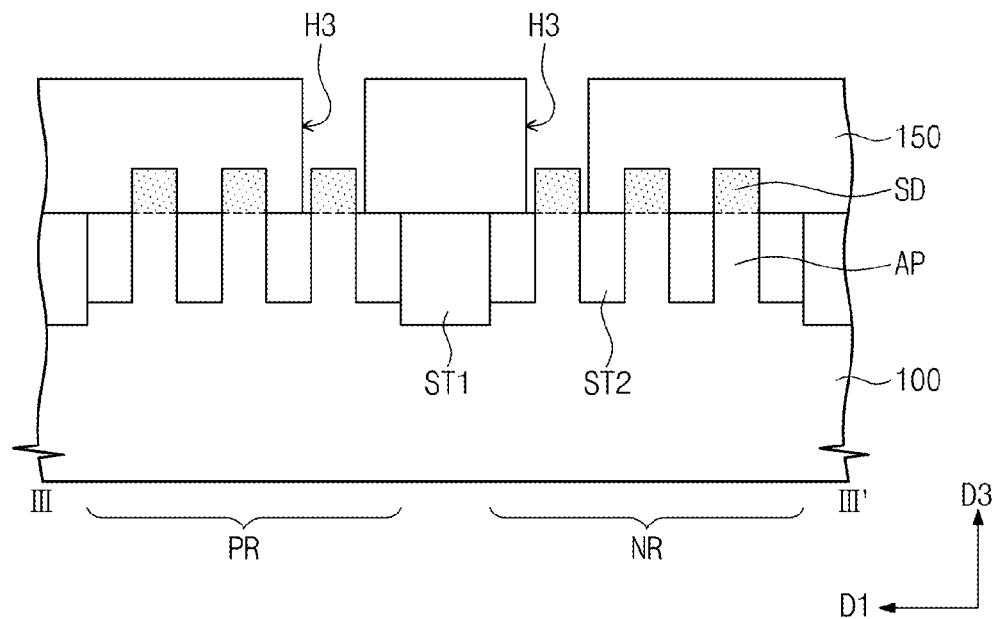
FIG. 14D is a cross-sectional view taken along line III-III' of FIG. 14A.
Figure 14E:
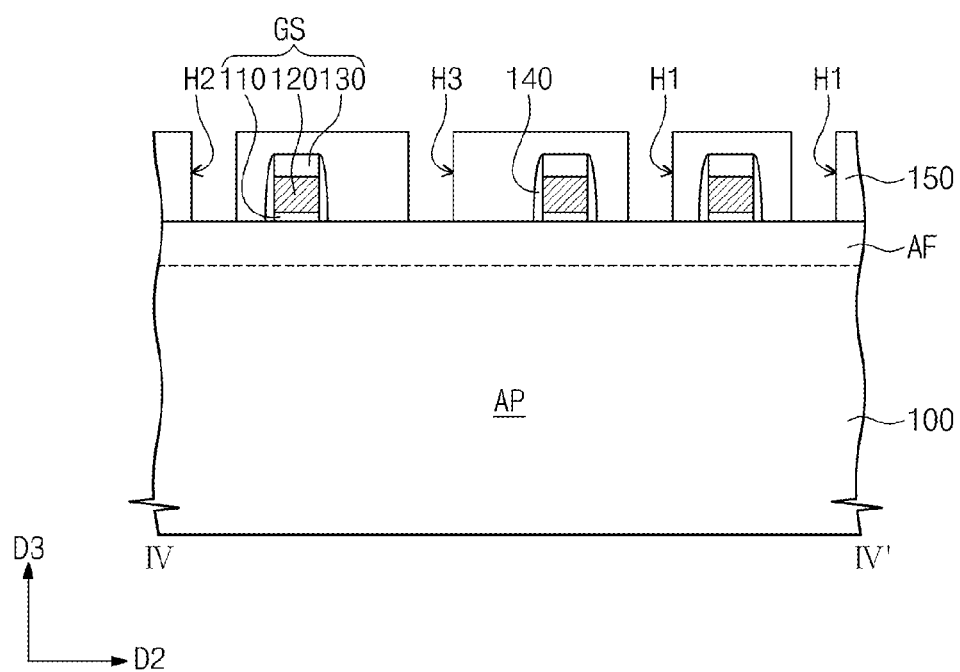

Referring to FIGS. 11A, 11B, and 11C, a device isolation structure or simply "device isolation" may be formed in a substrate 100 to define active regions and active patterns in the active regions. The device isolation structure may be formed by a shallow-trench isolation (STI) process and may include a silicon oxide layer. The device isolation structure may include first device isolation patterns ST1 and second device isolation patterns ST2.

Each of the device isolation patterns ST1 and ST2 may have a depth in a direction opposite to the third direction D3. The third direction D3 may be perpendicular to the first and second directions D1 and D2 and hence, may be perpendicular to the top surface of the substrate 100. In an embodiment, the depths of the second device isolation patterns ST2 may be smaller than those of the first device isolation patterns ST1. In this case, the second device isolation patterns ST2 may be formed by a process different from a process of forming the first device isolation patterns ST1. In another embodiment, the second device isolation patterns ST2 and the first device isolation patterns ST1 may be formed at the same time. In this case, the depths of the second device isolation patterns ST2 may be substantially equal to those of the first device isolation patterns ST1.

The active regions may include a PMOSFET region PR and an NMOSFET region NR which are isolated from each other by the first device isolation patterns ST1. The active regions may be the same as described with reference to FIGS. 10A to 10E.

Referring to FIGS. 12A, 12B, 12C, and 12D, gate structures GS may be formed on the substrate 100. The gate structures GS may extend in the first direction D1 to intersect the active patterns AP. Each of the gate structures GS may include a gate insulating pattern 110, a gate electrode 120, and a capping pattern 130 which are sequentially stacked on the substrate 100. Gate spacers 140 may be formed on both sidewall surfaces of each of the gate structures GS.

Referring to FIGS. 13A, 13B, 13C, and 13D, in an embodiment, one or more ion implantation processes may be performed on the substrate 100 having the gate structures GS to form the source/drain regions SD. The source/drain regions SD may be formed in the upper portions (e.g., active fins AF) of the active patterns AP at both sides of each of the gate structures GS.

Alternatively, the source/drain regions may be formed by another method. In other words, the upper portions (e.g., the active fins AF) of the active patterns AP disposed at both sides of each of the gate structures GS may be removed, and a selective epitaxial growth (SEG) process may be performed using lower portions of the active patterns AP as a seed to form the source/drain regions SD. The source/drain regions SD formed by the SEG process may be doped in-situ or by one or more ion implantation processes. The source/drain region SD may be doped with impurities of a conductivity type different from that of the active region AP. Unlike what is shown in the drawings, top surfaces of the source/drain regions SD may be curved. In an embodiment, the source/drain regions SD may have top surfaces that are upwardly convex.

Otherwise, the source/drain regions SD may be the same as those described with reference to FIGS. 10A to 10E.

Next, a first interlayer insulating layer 140 covering the gate structures GS may be formed on the substrate 100. The first interlayer insulating layer 150 may include at least one of a silicon oxide layer and a silicon oxynitride layer.

Referring to FIGS. 14A, 14B, 14C, 14D, and 14E, a patterning process may be performed to form standard contact holes H1, first modified contact holes H2, and second modified contact holes H3 which penetrate the first interlayer insulating layer 150. To form the contact holes H1, H2, and H3, a layout of a semiconductor device according to the present embodiment may be first formed. In an embodiment, the method of making the layout of the semiconductor device may be the same as described with reference to FIG. 6. In another embodiment, the layout directly corresponding to the contact holes H1, H2, and H3 may be made by the same method as described with reference to FIGS. 7 and 8. Next, a mask defining the contact holes H1, H2, and H3 may be formed on the basis of the layout. The mask may correspond to a reticle used in a photolithography process. A horizontal cross section of the mask may correspond to the plan view of FIG. 14 which illustrates the semiconductor device according to the present embodiment.

The standard contact holes H1 may be spaced apart from each other with at least one gate structure GS interposed therebetween. Each of the standard contact holes H1 may have a standard area A0. In an embodiment, one standard contact hole H1 may expose two source/drain regions SD. The standard contact holes H1 disposed one side of the gate structure GS may be arranged alongside one sidewall surface of the gate structure GS in the first direction D1.

At least one of the first modified contact holes H2 may be disposed at one side of at least one of the gate structures GS. The first modified contact hole H2 may be spaced apart from the at least one gate structure GS by a first distance S1 in the second direction D2. The first modified contact hole H2 may have a first area A1. The first area A1 may be greater than the standard area A0. In an embodiment, the first modified contact hole H2 may expose three source/drain regions SD. In addition, the first modified contact holes H2 may be adjacent to each other and may be arranged in the first direction D1. One of the first modified contact holes H2 may be formed in the PMOSFET region PR, and another of the first modified contact holes H2 may be formed in the NMOSFET region NR.

At least one of the second modified contact holes H3 may be disposed at another side of the at least one of the gate structures GS. In other words, the second modified contact hole H3 may be spaced apart from the first modified contact hole H2 with the at least one gate structure GS interposed therebetween. The second modified contact hole H3 may be spaced apart from the at least one gate structure GS by a second distance S2 in the second direction D2. The second distance S2 may be greater than the first distance S1. In an embodiment, the second distance S2 may range from 1.5 times to 2.5 times the first distance S1. The second modified contact hole H3 may have a second area A2. The second area A2 may be smaller than the standard area A0. In an embodiment, the second modified contact hole H3 may expose one source/drain region SD. In addition, the second modified contact holes H3 may be adjacent to each other and may be arranged in the first direction D1. One of the second modified contact holes H3 may be formed in the PMOSFET region PR, and another of the second modified contact holes H3 may be formed in the NMOSFET region NR.

The patterning process comprising photolithography using the reticle may be the substantially same as that described with reference to FIGS. 5A to 5C.

Referring again to FIGS. 10A to 10E, a conductive layer filling the contact holes H1, H2, and H3 may be formed on the interlayer insulating layer 150. The conductive layer may include a metal-silicide. For example, the conductive layer may include at least one of titanium silicide, tantalum silicide, and tungsten silicide. The conductive layer may further include a metal layer. For example, the metal layer may include at least one of titanium, tantalum, and tungsten. In other words, the conductive layer may include the metal silicide layer and the metal layer disposed on the metal silicide layer. In addition, the conductive layer may further include a conductive metal nitride. The conductive layer may be planarized until the first interlayer insulating layer 150 is exposed, thereby forming contacts CA, CA1, and CA2 locally in the contact holes H1, H2, and H3. The contacts CA, CA1, and CA2 may include standard contacts CA formed in the standard contact holes H1, first modified contacts CA1 formed in the first modified contact holes H2, and second modified contacts CA2 formed in the second modified contact holes H3. Due to the planarization process, top surfaces of the contacts CA, CA1, and CA2 may be substantially coplanar with a top surface of the first interlayer insulating layer 150.

The standard contacts CA may penetrate the first interlayer insulating layer 150 so as to be connected to the source/drain regions SD at both sides of at least one gate structure GS. In an embodiment, the standard contacts CA may have bar shapes extending in the first direction D1 when viewed from above, i.e., in plan.

The first modified contacts CA1 may penetrate the first interlayer insulating layer 150 so as to be connected to the source/drain regions SD at one side of at least one gate structure GS. In an embodiment, the first modified contacts CA1 may have bar shapes extending in the first direction D1 when viewed from above, i.e., in plan. Each of the first modified contacts CA1 may have a first width W1 in the second direction D2 and a first length L1 in the first direction D1.

The second modified contacts CA2 may penetrate the first interlayer insulating layer 150 so as to be connected to the source/drain region SD at another side of the at least one gate structure GS. In an embodiment, the second modified contact CA2 may have a bar shape extending in the first direction D1 when viewed from above, i.e., in plan. The second modified contact CA2 may have a second width W2 in the second direction D2 and a second length L2 in the first direction D1. The second width W2 may be smaller than or equal to the first width W1. The second length L2 may be smaller than the first length L1.

Even though not shown in the drawings, gate contacts electrically connected to the gate electrodes 120 may be formed on the gate structures GS.

A second interlayer insulating layer 160 may be formed on the first interlayer insulating layer 150 and the contacts CA, CA1, and CA2. The second interlayer insulating layer 160 may include at least one of a silicon oxide layer and a silicon oxynitride layer. Plugs 165 may be formed to penetrate the second interlayer insulating layer 160. The plugs 165 may be in contact with the contacts CA, CA1, and CA2 and the gate contacts.

Next, interconnections 172, 174, and 176 electrically connected to the contacts CA, CA1, and CA2 and the gate contacts may be formed on the second interlayer insulating layer 160. In an embodiment, the interconnections 172, 174, and 176 may include a first power node 172, a second power node 174, and an output node 176. The interconnections 172, 174, and 176 may be the same as those described with reference to FIGS. 10A to 10E.

[Applications]

Figure 15:
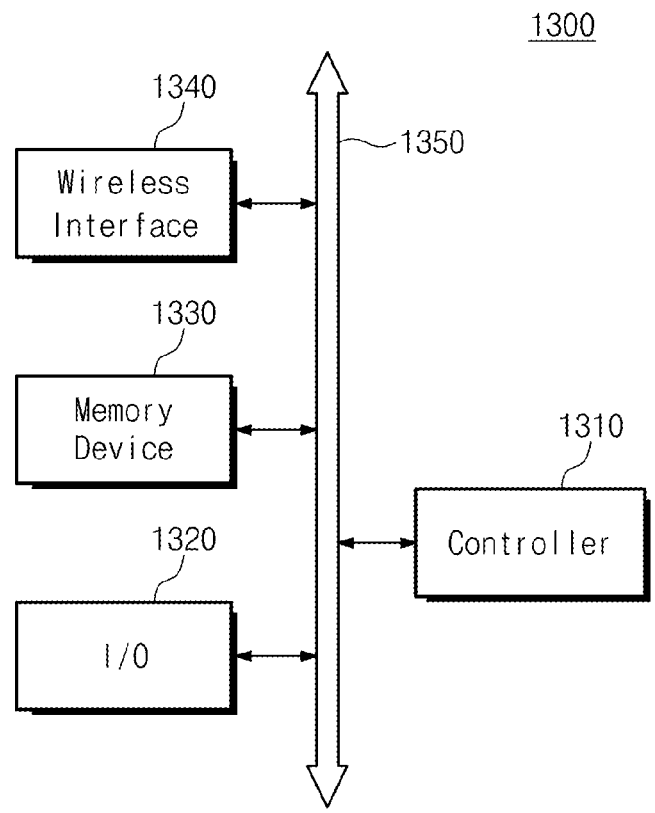
FIGS. 15 and 16 are block diagrams of electronic devices including semiconductor devices according to embodiments of the inventive concepts.
Figure 16:
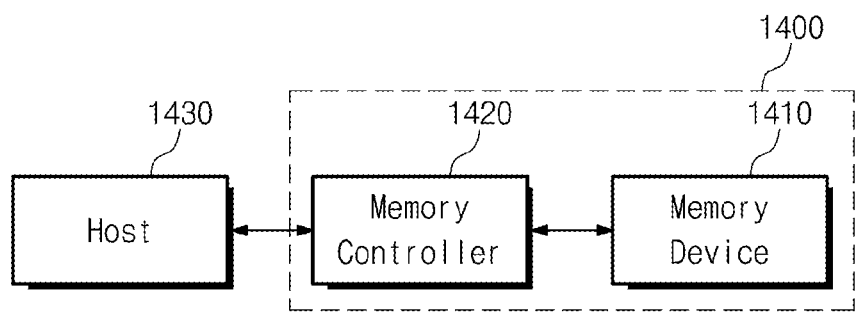

FIGS. 15 and 16 are block diagrams of electronic devices including semiconductor devices according to embodiments of the inventive concepts.

Referring to FIG. 15, an electronic device 1300 including at least one of the semiconductor devices according to the above-described embodiments of the inventive concepts may be a personal digital assistant (PDA), a laptop computer, a portable computer, a web tablet, a wireless phone, a portable phone, a mobile phone, a digital music player, a cable/wireless electronic device, or any complex electronic device including a combination of at least two of the same. The electronic device 1300 may include a controller 1310, an input/output (I/O) device 1320 (e.g., a keypad, a keyboard, or a display device), a memory device 1330, and a wireless interface unit 1340 which are coupled to each other through a data bus 1350. For example, the controller 1310 may include at least one of a microprocessor, a digital signal processor, a microcontroller, and a logic device having a similar function to any one of the same. The memory device 1330 may store, for example, commands to be executed by the controller 1310. Additionally, the memory device 1330 may store a user's data. The memory device 1330 may include at least one of the semiconductor devices according to embodiments of the inventive concepts. The electronic device 1300 may transmit data to a wireless communications network using a radio frequency (RF) signal and/or may receive data from the network by means of the wireless interface unit 1340. For example, the wireless interface unit 1340 may include an antenna or a wireless transceiver. The electronic device 1300 may be used to realize a communication interface protocol of a communications system such as CDMA, GSM, NADC, E-TDMA, WCDMA, CDMA2000, Wi-Fi, Muni Wi-Fi, Bluetooth, DECT, Wireless USB, Flash-OFDM, IEEE 802.20, GPRS, iBurst, WiBro, WiMAX, WiMAX-Advanced, UMTS-TDD, HSPA, EVDO, LTE-Advanced, or MMDS.

Referring to FIG. 16, at least one of the semiconductor devices according to the embodiments of the inventive concepts may be used to realize a memory system 1400. The memory system 1400 may include a memory device 1410 and a memory controller 1420 that are used to store mass amounts of data. The memory controller 1420 may control the memory device 1410 to read/write data from/into the memory device 1410 in response to read/write request of a host 1430. The memory controller 1420 may make an address mapping table for translating an address provided from the host 1430 (e.g., a mobile device or a computer system) into a physical address of the memory device 1410. The memory device 1410 may include at least one of the semiconductor devices according to the inventive concepts.

As described above, in a semiconductor device according to the inventive concept, the area of the first modified contact connected to the power node may be maximized so that the voltage drop (IR-DROP) may be minimized. In addition, the spacing between the second modified contact connected and the output node may be maximized and the area of the second modified contact may be minimized. Accordingly, the parasitic capacitance may be minimized. As a result, the electrical characteristics of the semiconductor device may be improved.

Furthermore, the modified contacts whose sizes and spacing from gate structure are different from those of the standard contacts may be formed using a layout annotated with markers according to the inventive concepts. Thus, the modified contacts may be formed using one standard cell library, i.e., without the need to create, maintain and/or consult with a plurality of cell libraries.

Finally, embodiments of the inventive concept and examples thereof have been described above in detail. The inventive concepts may, however, be embodied in many different forms and should not be construed as being limited to the embodiments described above. Rather, these embodiments were described so that this disclosure is thorough and complete, and fully conveys the inventive concepts to those skilled in the art. Thus, the true spirit and scope of the inventive concepts is not limited by the embodiments and examples described above but by the following claims.

What is claimed is:

1. A semiconductor device comprising:
a substrate having a plurality of active regions;
device isolation disposed in the substrate to define the active regions, upper portions of the active regions protruding upward beyond the device isolation;
a gate structure intersecting the plurality of active regions and extending longitudinally in a first direction parallel to a top surface of the substrate;
a plurality of first source/drain regions and a plurality of second source/drain regions adjacent opposite sides of the gate structure, respectively; and
a first modified contact and a second modified contact in contact with the first source/drain region and the second source/drain region, respectively,
wherein each of the first source/drain regions is in contact with the first modified contact,
at least one of the second source/drain regions is in contact with the second modified contact, and
the number of the second source/drain regions in contact with the second modified contact is less than the number of the first source/drain regions in contact with the first modified contact.

2. The semiconductor device of claim 1, further comprising a power node to which a power voltage is applied, and an output node
wherein the first modified contact is connected to the power node, and
the second modified contact is connected to the output node.

3. The semiconductor device of claim 1, wherein the first modified contact is spaced apart from the gate structure in a second direction intersecting the first direction,
wherein the second modified contact is spaced apart from the gate structure in a direction opposite to the second direction.

4. The semiconductor device of claim 1, wherein the first modified contact has a first sidewall surface facing the gate structure,
the second modified contact has a second sidewall surface facing the gate structure,
top surfaces of the first and second modified contacts are disposed at the same level in the device, and
the area of the first sidewall surface is greater than the area of the second sidewall surface.

5. The semiconductor device of claim 1, wherein the upper portions of the active regions include active fins disposed between the first source/drain regions and the second source/drain regions, and
wherein the gate structure covers sidewall surfaces and a top surface of each of the active fins.

6. The semiconductor device of claim 5, wherein
the area of contact between the first modified contact and the first source/drain regions is greater than the area of contact between the second modified contact and the at least one of the second source/drain regions.

7. The semiconductor device of claim 6, wherein the first modified contact is longer than the second modified contact in the first direction.

8. The semiconductor device of claim 1, wherein the gate structure comprises: a gate electrode; and a gate insulating pattern disposed between the gate electrode and the active regions, and
wherein the gate insulating pattern extends along a bottom surface of the gate electrode in the first direction.

9. The semiconductor device of claim 1, comprising first, second, and third respective ones of the gate structures,
wherein the first, second, and third gate structures are spaced apart from each other in a second direction that intersects the first direction,
the first modified contact is disposed between the first and second gate structures,
the second modified contact is disposed between the second and third gate structures, and
the distance between the first and second gate structures is smaller than a distance between the second and third gate structures.

10. The semiconductor device of claim 9, wherein the distance between the second and third gate structures ranges from 1.5 times to 2.5 times the distance between the first and second gate structures.

11. A semiconductor device comprising:
a first power node, a second power node and an output node;
an input node;
a first transistor whose gate is constituted by the input node;
a second transistor whose gate is constituted by the input node;
a first modified contact electrically connecting the first power node to the first transistor;
a second modified contact electrically connecting the first transistor to the output node;
a third modified contact electrically connecting the second power node to the second transistor; and
a fourth modified contact electrically connecting the second transistor to the output node, and
wherein a connection area between the first modified contact and the first transistor is greater than a connection area between the second modified contact and the first transistor, and a connection area between the third modified contact and the second transistor is greater than a connection area between the fourth modified contact and the second transistor.

12. A semiconductor device comprising:
a plurality of transistors constituted by a common gate extending longitudinally across active regions of a substrate in a first direction, first source/drain regions adjacent one side of the common gate, and second source/drain regions adjacent the other side of the common gate;
an insulating layer disposed on the substrate;
a first standard contact extending vertically in the insulating layer and electrically connected to one of the first source/drain regions constituting a first one of the transistors;
a second standard contact extending vertically in the insulating layer and electrically connected to one of the second source drain regions constituting the first one of the transistors;
a first modified contact extending vertically in the insulating layer and electrically connected to one of the first source drain regions constituting a second one of the transistors; and
a second modified contact extending vertically in the insulating layer and connected to one of the second source drain regions constituting the second one of the transistors, and
wherein in a plan view of the device:
the first standard contact has the same shape as the second standard contact,
the distance between the first standard contact and the common gate in a second direction perpendicular to the first direction is the same as the distance between the second standard contact and the common gate in the second direction, the distance between the first modified contact and the common gate in the second direction is less than the distance between the second modified contact and the common gate in the second direction,
the distance between the first modified contact and the common gate in the second direction is different from that between each of the standard contacts and the common gate, or the shape of the first modified contact is different from each of those of the standard contacts, and
the distance between the second modified contact and the common gate in the second direction is different from that between each of the standard contacts and the common gate, or the shape of the second modified contact is different from each of those of the standard contacts.

13. The semiconductor device of claim 12, wherein, in the plan view, each of the standard and modified contacts is oblong with its longest dimension extending in the first direction.

14. The semiconductor device of claim 12, wherein, in the plan view, the first modified contact has a larger area than the second modified contact.

15. The semiconductor device of claim 12, further comprising:
a third modified contact extending vertically in the insulating layer and electrically connected to one of the first source/drain regions constituting a third one of the transistors;
a fourth modified contact extending vertically in the insulating layer and electrically connected to one of the second source/drain regions constituting the third one of the transistors;
a first electrically conductive strip, constituting a first power node of a circuit, extending on the insulating layer and to which the first modified contact is electrically connected;
a second electrically conductive strip, constituting a second power node of the circuit, extending on the insulating layer and to which the third modified contact is electrically connected; and
a third electrically conductive strip, constituting an ouput node of the circuit, extending on the insulating layer and to which the second and fourth modified contacts are each electrically connected, and
wherein in the plan view of the device the distance between the third modified contact and the common gate in the second direction is less than the distance between the fourth modified contact and the common gate in the second direction.

16. The semiconductor device of claim 15, wherein, in the plan view, the third modified contact has a larger area than the fourth modified contact.

17. The semiconductor device of claim 1, wherein the distance between the gate structure and the first modified contact is smaller than the distance between the gate structure and the second modified contact.

* * * * *